(12) United States Patent
Tokunaga et al.

(10) Patent No.: US 7,782,651 B2
(45) Date of Patent: Aug. 24, 2010

(54) SEMICONDUCTOR DEVICE INCLUDING STORAGE DEVICE AND METHOD FOR DRIVING THE SAME

(75) Inventors: Hajime Tokunaga, Kanagawa (JP); Toshihiko Saito, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 226 days.

(21) Appl. No.: 11/976,202

(22) Filed: Oct. 22, 2007

(65) Prior Publication Data

US 2008/0101108 A1   May 1, 2008

(30) Foreign Application Priority Data

Oct. 24, 2006   (JP)   .............................. 2006-288788

(51) Int. Cl.
G11C 11/00   (2006.01)
(52) U.S. Cl. ....................................... 365/148; 365/163
(58) Field of Classification Search ................. 365/148, 365/163
See application file for complete search history.

(56) References Cited

U.S. PATENT DOCUMENTS

| | | | |
|---|---|---|---|
| 5,206,665 A | 4/1993 | Kawade et al. | |
| 5,389,475 A | 2/1995 | Yanagisawa et al. | |
| 5,625,219 A | 4/1997 | Takagi | |
| 5,714,795 A | 2/1998 | Ohmi et al. | |
| 5,780,919 A | 7/1998 | Chua et al. | |
| 5,798,534 A | 8/1998 | Young | |
| 5,994,757 A | 11/1999 | Ichikawa et al. | |
| 6,034,882 A | 3/2000 | Johnson et al. | |
| 6,051,851 A | 4/2000 | Ohmi et al. | |
| 6,288,437 B1 | 9/2001 | Forbes et al. | |
| 6,465,282 B1 | 10/2002 | Többen et al. | |
| 6,528,815 B1 | 3/2003 | Brown et al. | |
| 6,750,530 B1 | 6/2004 | Klaasen et al. | |

(Continued)

FOREIGN PATENT DOCUMENTS

| | | |
|---|---|---|
| EP | 0 666 593 | 8/1995 |
| EP | 0 680 087 | 11/1995 |
| JP | 56-044198 | 4/1981 |

(Continued)

OTHER PUBLICATIONS

International Search Report (Application No. PCT/JP2007/070969) dated Jan. 22, 2008.
Written Opinion (Application No. PCT/JP2007/070969) dated Jan. 22, 2008.

*Primary Examiner*—Huan Hoang
(74) *Attorney, Agent, or Firm*—Eric J. Robinson; Robinson Intellectual Property Law Office, P.C.

(57) ABSTRACT

A structure of a storage device which can operate memory elements utilizing silicide reaction using the same voltage value for writing and for reading, and a method for driving the same are proposed. The present invention relates to a storage device including a memory element and a circuit which changes a polarity of applying voltage to the memory element for writing (or reading) into a different polarity of that for reading (or writing). The memory element includes at least a first conductive layer, a film including silicon formed over the first conductive layer, and a second conductive layer formed over the silicon film. The first conductive layer and the second conductive layer of the memory element are formed using different materials.

20 Claims, 10 Drawing Sheets

U.S. PATENT DOCUMENTS

| | | |
|---|---|---|
| 6,828,685 B2 | 12/2004 | Stasiak |
| 6,844,609 B2 | 1/2005 | Motsiff et al. |
| 6,962,844 B2 | 11/2005 | Stasiak |
| 6,979,880 B2 | 12/2005 | Bhattacharyya et al. |
| 7,034,380 B2 | 4/2006 | Andideh |
| 7,092,278 B2 * | 8/2006 | Ishida et al. ............ 365/148 |
| 2003/0156449 A1 | 8/2003 | Ooishi |
| 2003/0183699 A1 | 10/2003 | Masui |
| 2003/0230746 A1 | 12/2003 | Stasiak |
| 2004/0026690 A1 | 2/2004 | Bernds et al. |
| 2004/0027849 A1 | 2/2004 | Yang et al. |
| 2004/0129960 A1 | 7/2004 | Maruyama et al. |
| 2004/0164302 A1 | 8/2004 | Arai et al. |
| 2004/0217441 A1 | 11/2004 | Lehmann et al. |
| 2005/0006640 A1 | 1/2005 | Jackson et al. |
| 2005/0179133 A1 | 8/2005 | Iwasaki et al. |
| 2006/0097250 A1 | 5/2006 | Koyama et al. |
| 2006/0163743 A1 * | 7/2006 | Kuwabara et al. ............ 257/773 |
| 2006/0175648 A1 | 8/2006 | Asami |
| 2006/0220252 A1 | 10/2006 | Yukawa et al. |
| 2006/0263634 A1 | 11/2006 | Yamazaki |

FOREIGN PATENT DOCUMENTS

| | | |
|---|---|---|
| JP | 04-028249 | 1/1992 |
| JP | 04-373147 | 12/1992 |
| JP | 07-176703 | 7/1995 |
| JP | 07-176772 | 7/1995 |
| JP | 07-263647 | 10/1995 |
| JP | 07-297293 | 11/1995 |
| JP | 08-139197 | 5/1996 |
| JP | 3501416 | 3/2004 |
| JP | 2004-214281 | 7/2004 |
| JP | 2005-228841 | 8/2005 |
| WO | WO 96/07300 | 3/1996 |
| WO | WO 2004/015778 | 2/2004 |
| WO | WO 2005/096380 | 10/2005 |
| WO | WO 2005/119779 | 12/2005 |

* cited by examiner

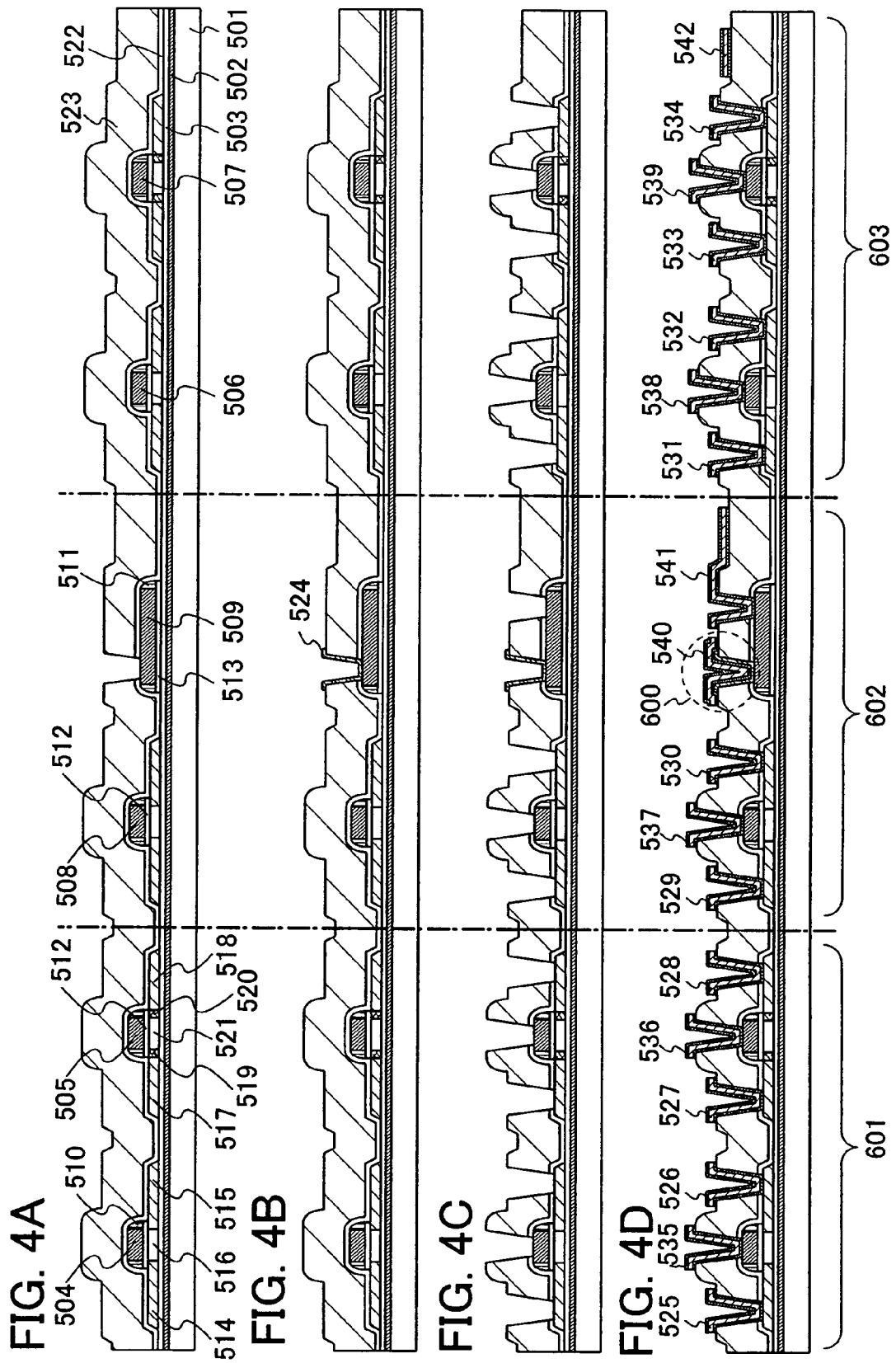

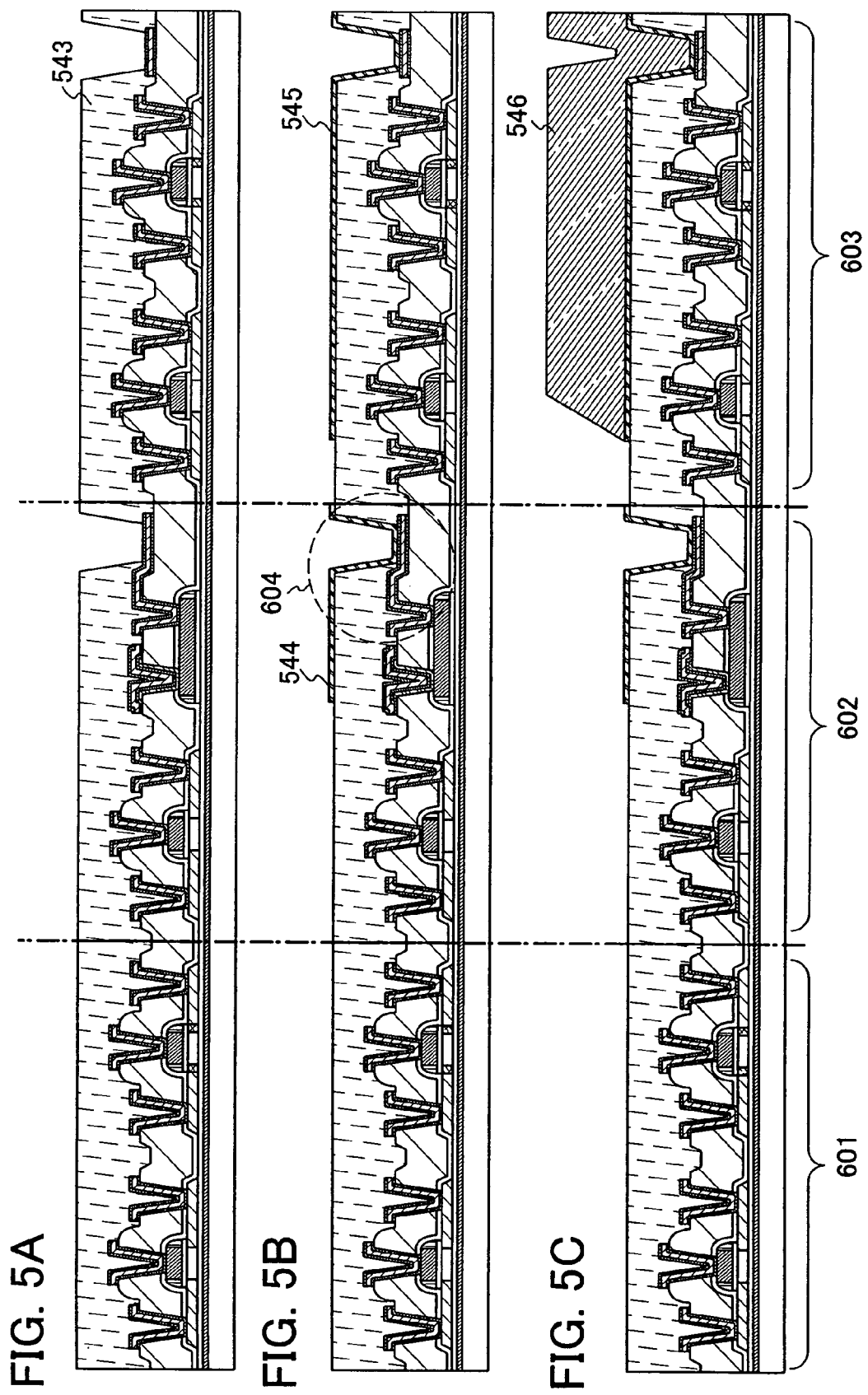

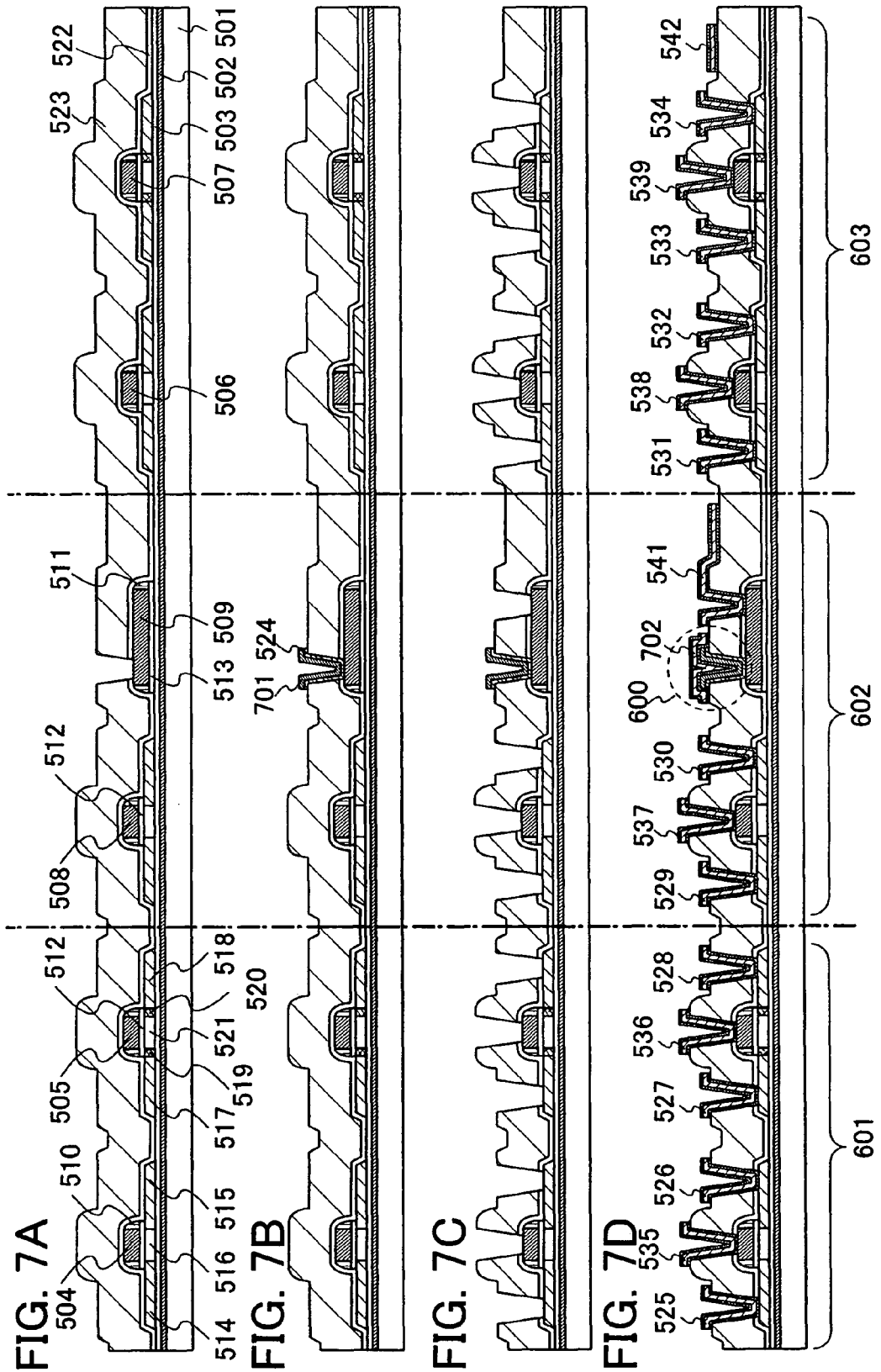

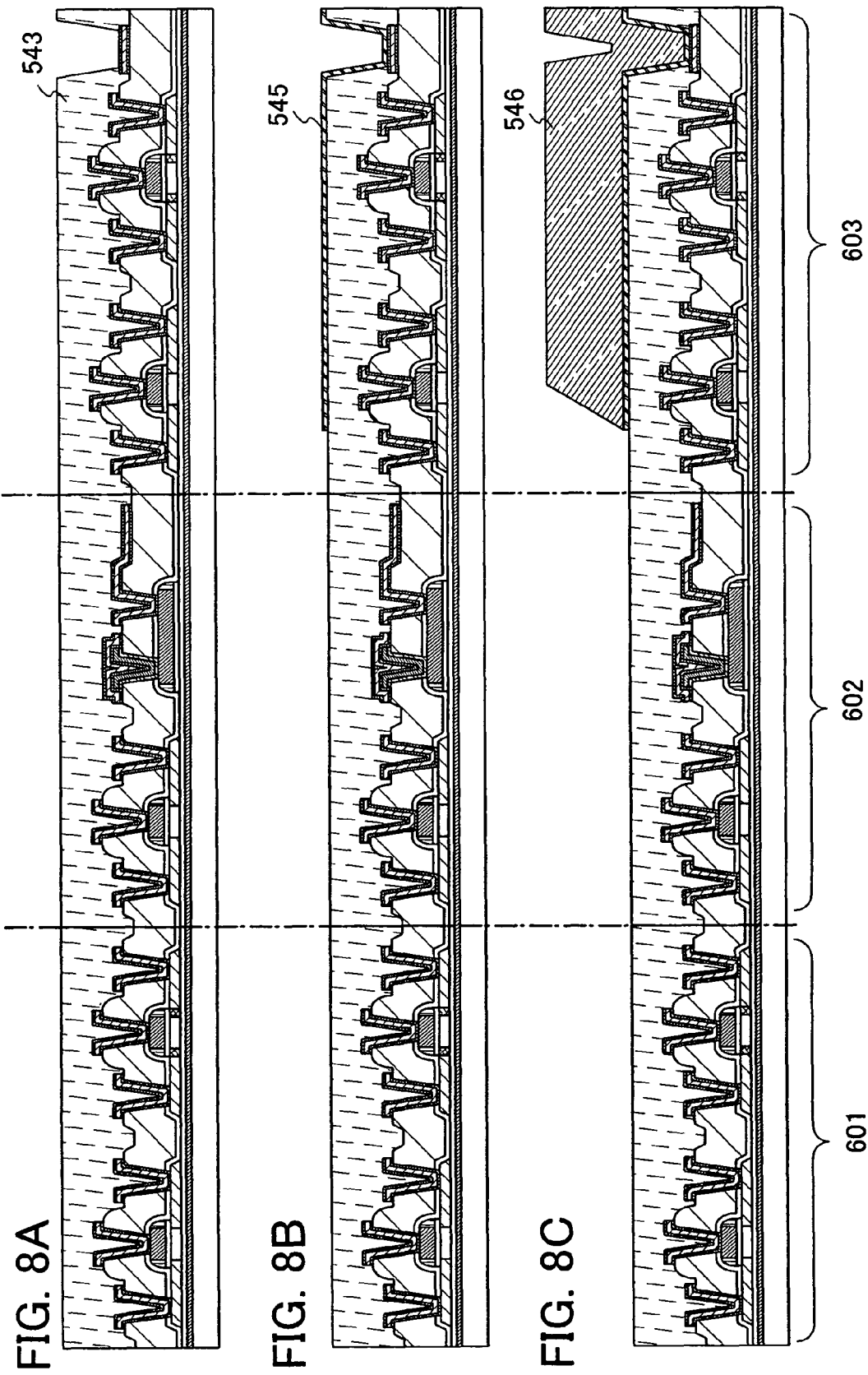

1520

1520

1520

1520

1520

1520

SEMICONDUCTOR DEVICE INCLUDING STORAGE DEVICE AND METHOD FOR DRIVING THE SAME

BACKGROUND OF THE INVENTION

1. Field of the Invention

The present invention relates to a semiconductor device including a storage device including a memory element utilizing silicide reaction, and a method for driving the same.

2. Description of the Related Art

In modern society, where many electronic appliances are used, various data are generated and used; therefore, storage devices are required to store the data. Various storage devices produced and used today have different advantages and disadvantages, and are used properly depending on the data to be stored and used.

For example, volatile memory that loses its memory content when the power is turned off includes DRAM and SRAM. The applications of volatile memory are significantly limited because memory content is lost when the power is turned off; however, each of them is used as a main storage device or cash memory of a computer taking advantage of a short access time. Since DRAM has small memory cells, large-capacity DRAM can be produced easily. However, it is controlled in a complex manner and consumes much power. SRAM includes a memory cell formed from a CMOS and is easily manufactured and controlled; however, it is difficult to obtain large-capacity SRAM since one memory cell needs six transistors.

Nonvolatile memory that holds its memory content even after the power is turned off includes: rewritable memory into which data can be rewritten many times; write-once memory into which data can be written by a user only once; mask ROM of which data content determined in the manufacturing of the memory cannot be rewritten; and the like. As the rewritable memory, there are EPROM, flash memory, ferroelectric memory, and the like. The EPROM allows an easy writing of data and unit cost per bit is relatively low; however, a program device and an eraser dedicated to writing and erasing are required. The flash memory and the ferroelectric memory can be rewritten on a substrate used, have a short access time, and consume less power; however, steps for manufacturing a floating gate and a ferroelectric layer are required. Thus, the unit cost per bit is high.

Each write-once memory includes a fuse, an antifuse, a cross pointer diode, an OLED (organic light emitting diode), a bistable liquid crystal element, and other devices whose states are changed by heat or light. Further, in recent years, memory elements using silicide reaction are also developed (for example, Reference 1: Japanese Patent No. 3501416). Memory described in Reference 1 includes a plurality of memory elements formed using conductive films serving as a cathode and an anode and an amorphous silicon film provided between the cathode and the anode.

As a method for writing data into memory, a method for applying electrical action is proposed. In the case where data is written by electrical action, an element with application of high voltage between a pair of electrodes to make an amorphous silicon film therein silicided and an element with no application of high voltage between a pair of electrodes to make an amorphous silicon film therein silicided are manufactured, and data is written into the memory. Then, voltage is applied to the memory elements for reading and a difference in resistance between the memory elements are read, whereby data of "0" and data of "1" can be distinguished from each other.

However, in the memory into which data is written by electrical action, both the memory element in which the silicon film is silicided and the memory element in which the silicon film is not silicided exist in the memory. Accordingly, when the same voltage as that applied during writing is applied for reading, the silicon film of the memory element which has not been silicided is also silicided; therefore, it is necessary to change voltage value for the memory elements for reading to be different from voltage value for writing. For example, provided that writing voltage is X [V], it is necessary to apply lower voltage than X for reading in order to prevent the silicon film of the memory element in which writing is not performed, from being changed by silicide reaction. In general, as an external power supply of a memory, an external power supply is used, from which a voltage value used for reading data written into a memory element is output. Accordingly, for writing data into the memory element, voltage necessary for writing is obtained by boosting the external power supply voltage with the use of a boosting circuit.

A generally-used circuit for changing a voltage value, such as a boosting circuit, is large in volume. Therefore, it is difficult to miniaturize memory in which a circuit for changing a voltage value is needed.

SUMMARY OF THE INVENTION

The present invention proposes a structure of a storage device which can operate memory elements utilizing silicide reaction with the use of the same voltage value under writing and reading operations, and a method for driving the same.

One of storage devices of the present invention includes a memory element having a first conductive layer, a film including silicon formed over the first conductive layer, and a second conductive layer formed over the film including silicon, wherein the second conductive layer includes a material different from that of the first conductive layer. At least one of the first conductive layer and the second conductive layer is formed using a material which is able to undergo silicide reaction with the film including silicon. Further, another one of storages device of the present invention includes a memory element and a circuit which changes a polarity of voltage applied to the memory element under reading operation and under writing operation. When data is written into the memory element, a high level voltage value is applied to the first conductive layer and a low level voltage value is applied to the second conductive layer; and when the data written into the memory element is read, the high level voltage value is applied to the second conductive layer and the low level voltage value is applied to the first conductive layer. Thus, a storage device can be driven.

A storage device of the present invention includes a memory element having a first conductive layer, a film including silicon formed over the first conductive layer, and a second conductive layer formed over the film including silicon, wherein the second conductive layer includes a material different from that of the first conductive layer; a first transistor having one electrode electrically connected to the first conductive layer; and a second transistor having one electrode electrically connected to the first conductive layer.

A storage device of the present invention includes a memory element having a first conductive layer, a film including silicon formed over the first conductive layer, and a second conductive layer formed over the film including silicon, wherein the second conductive layer includes a material different from that of the first conductive layer; a first transistor having one electrode electrically connected to the first conductive layer; and a second transistor having one electrode electrically connected to the first conductive layer, the other electrode grounded, and a gate electrode connected to the second conductive layer.

A storage device of the present invention includes a memory element having a first conductive layer, a film including silicon formed over the first conductive layer, and a second conductive layer formed over the film including silicon, wherein the second conductive layer includes a material different from that of the first conductive layer; a first transistor having one electrode electrically connected to the first conductive layer; a second transistor having one electrode electrically connected to the first conductive layer; and a third transistor having one electrode connected to a gate electrode of the second transistor.

A storage device of the present invention includes a memory element having a first conductive layer, a film including silicon formed over the first conductive layer, and a second conductive layer formed over the film including silicon, wherein the second conductive layer includes a material different from that of the first conductive layer; a first transistor having one electrode electrically connected to the first conductive layer; a second transistor having one electrode electrically connected to the first conductive layer and the other electrode grounded; and a third transistor having one electrode electrically connected to the second conductive layer, the other electrode electrically connected to a gate electrode of the second transistor, and a gate electrode electrically connected to a gate electrode of the first transistor.

A method for driving a storage device of the present invention including a memory element having a first conductive layer, a film including silicon formed over the first conductive layer, and a second conductive layer formed over the film including silicon, wherein the second conductive layer includes a material different from that of the first conductive layer; a first transistor having one electrode electrically connected to the first conductive layer; and a second transistor having one electrode electrically connected to the first conductive layer, the other electrode grounded, and a gate electrode connected to the second conductive layer, includes the steps of, when writing data into the memory element, applying a high level voltage value to the gate electrode of the first transistor to turn the first transistor on, applying a low level voltage value to the gate electrode of the second transistor to turn the second transistor off, applying the high level voltage value to the other electrode of the first transistor, applying the high level voltage value to the first conductive layer, and applying the low level voltage value to the second conductive layer; and when reading the data written into the memory element, applying the high level voltage value to the gate electrode of the first transistor to turn the first transistor on, applying the voltage value of the high level to the gate electrode of the second transistor to turn the second transistor on, and reading the potential of the first conductive layer from the other electrode of the first transistor, whereby a storage device can be driven.

A method for driving a storage device including a memory element having a first conductive layer, a film including silicon formed over the first conductive layer, and a second conductive layer formed over the film including silicon, wherein the second conductive layer includes a material different from that of the first conductive layer; a first transistor having one electrode electrically connected to the first conductive layer; a second transistor having one electrode electrically connected to the first conductive layer and the other electrode grounded; and a third transistor having one electrode electrically connected to the second conductive layer, the other electrode electrically connected to a gate electrode of the second transistor, and a gate electrode electrically connected to a gate electrode of the first transistor, includes the steps of, when writing data into the memory element, applying a high level voltage value to the gate electrode of the first transistor to turn the first transistor on, applying a low level voltage value to the gate electrode of the second transistor to turn the second transistor off, applying the high level voltage value to the gate electrode of the third transistor to turn the third transistor on, applying the high level voltage value to the first conductive layer, and applying the low level voltage value to the second conductive layer; and when reading the data written into the memory element, applying the high level voltage value to the gate electrode of the first transistor to turn the first transistor on, applying the high level voltage value to the gate electrode of the second transistor to turn the second transistor on, applying the high level voltage value to the gate electrode of the third transistor to turn the third transistor on, and reading the potential of the first conductive layer from the other electrode of the first transistor, whereby a storage device can be driven.

In the present invention, as the film including silicon, a film including amorphous silicon, a film including microcrystalline silicon, or a film including polycrystalline silicon can be used.

According to the present invention, the memory element utilizing silicide reaction can be operated with using the same voltage value for writing and for reading. It is not necessary to form a circuit which changes voltage values to be different for writing and for reading. Accordingly, the scale of a circuit can be drastically reduced.

BRIEF DESCRIPTION OF THE DRAWINGS

In the accompanying drawings:

FIGS. 4A to 4D are views illustrating a manufacturing step of a storage device of the present invention;

FIGS. 5A to 5C are views illustrating a manufacturing step of a storage device of the present invention;

FIGS. 7A to 7D are views illustrating a manufacturing step of a storage device of the present invention;

FIGS. 8A to 8C are views illustrating a manufacturing step of a storage device of the present invention;

DETAILED DESCRIPTION OF THE INVENTION

Figure 1A:
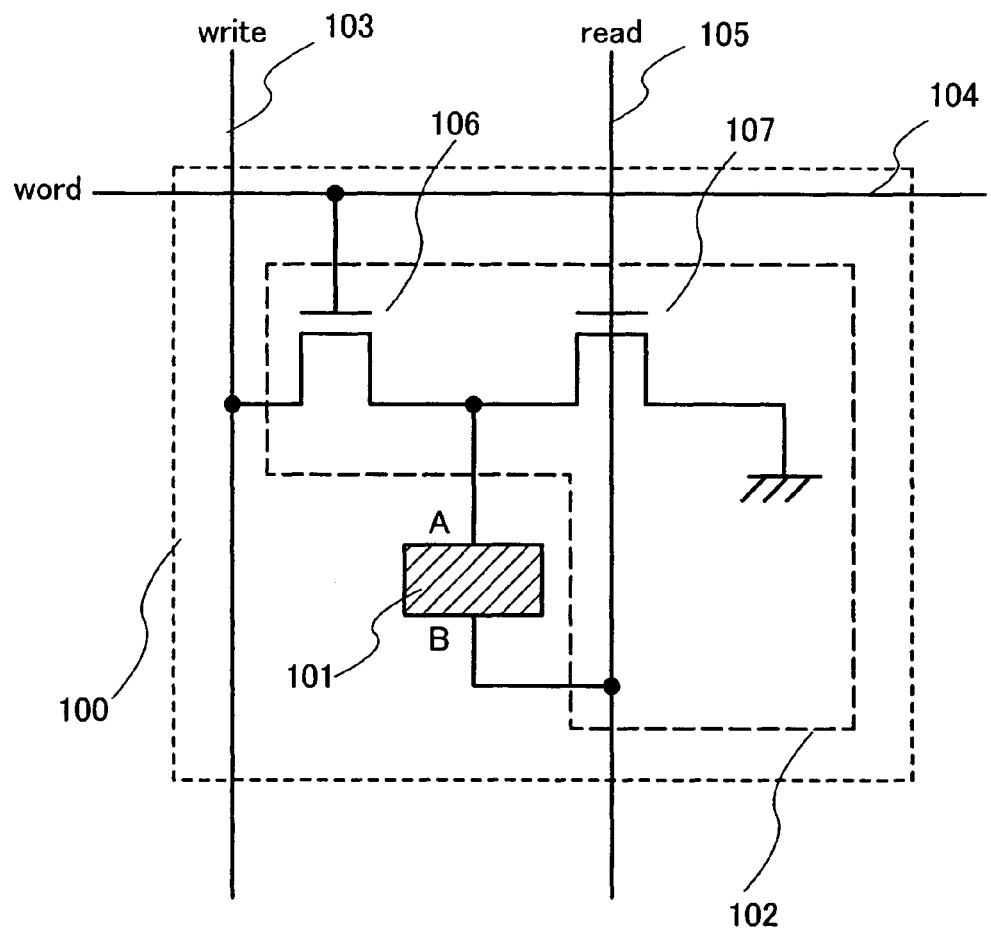
FIGS. 1A and 1B are views illustrating a configuration of a memory cell of the present invention.

Embodiment Modes of the present invention will be described below with reference to drawings. However, the present invention is not limited to the description given below, and it will be readily apparent to those skilled in the art that various changes and modifications in modes and details thereof can be made without departing from the purpose and scope of the present invention. Therefore, the present invention should not be interpreted as being limited to the description of the embodiment modes given below. It is to be noted that the same portion or a portion having the same function is denoted by the same reference numeral throughout the drawings, and the repetitive explanation thereof is omitted.

Note that in a thin film transistor including, as an active layer, a thin film including silicon formed over an insulating substrate or the like, it is difficult to distinguish between a source electrode and a drain electrode due to its structure. Therefore, one of a source electrode and a drain electrode is referred to as a first electrode (also referred to as one electrode) and the other is referred to as a second electrode (also referred to as the other electrode) except when the source electrode and the drain electrode particularly need to be distinguished. In general, in an n-channel transistor, an electrode with a low-level potential is a source electrode and one with a high-level potential is a drain electrode; in a p-channel transistor, an electrode with a high-level potential is a source electrode and one with a low-level potential is a drain electrode. Therefore, the above description applies when the description of a gate-source voltage or the like is given in explaining circuit operation.

Embodiment Mode 1

In this embodiment mode, a memory cell having a structure is described, which changes polarity of voltage applied to the memory element for writing and for reading.

First, a structure of a memory cell of this embodiment mode is described with reference to drawings.

FIG. 1A shows a schematic view of a circuit configuration of a memory cell of an embodiment mode of the present invention. A memory cell 100 of this embodiment mode includes a memory element 101; a circuit 102 which changes polarity of voltage applied to the memory element for writing and for reading; a first wiring 103; a second wiring 104; and a third wiring 105. In this embodiment mode, the circuit 102 includes a first transistor 106 and a second transistor 107. Further, in this embodiment mode, polarities of the first transistor 106 and the second transistor 107 are set to be n-channel type. The configuration of the circuit 102 is not limited to that shown in FIG. 1A.

In a circuit shown in FIG. 1A, a first electrode of the first transistor 106 is connected to the first wiring 103, and a gate electrode of the first transistor 106 is connected to the second wiring 104. A second electrode of the first transistor 106 is electrically connected to a first electrode of the second transistor 107 and a first electrode 108 of the memory element 101. A gate electrode of the second transistor 107 is connected to the third wiring 105, and a second electrode of the second transistor 107 is grounded. A second electrode 110 of the memory element 101 is connected to the third wiring 105.

Figure 1B:
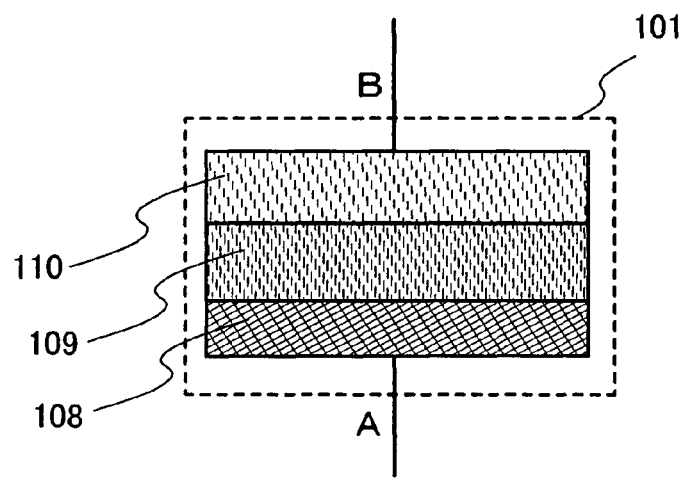

FIG. 1B shows a schematic view of the memory element 101. In this embodiment mode, the memory element 101 includes at least the first electrode 108, a film including silicon 109 formed over the first electrode 108, and the second electrode 110 formed over the film including silicon 109. In FIG. 1B, the first electrode 108 of the memory element 101 is arranged on the A point side in FIG. 1A, and the second electrode 110 is arranged on the B point side therein. The first electrode 108 or the second electrode 110 serves as an anode or a cathode. By applying predetermined voltage between the electrodes, the film including silicon 109 undergoes silicide reaction with the first electrode 108 or the second electrode 110. A region which undergoes silicide reaction is brought into a state in which the film including silicon is silicided and conductivity is changed. Therefore, by selecting whether or not voltage is applied in each element, two values corresponding to "a state in which the film including silicon is silicided" or "an initial state" in which the film including silicon is not silicided can be stored.

Here, a manufacturing step of the memory element 101 shown in FIG. 1B is described.

The first electrode 108 of the memory element 101 is formed over a substrate having an insulating surface. As the substrate having an insulating surface, a glass substrate, a quartz substrate, or the like can be used. Besides, as a plastic substrate, a substrate formed using polyethylene terephthalate (PET), polyethylene naphthalate (PEN), polyether sulfone (PES), acrylic, or the like can be selected.

First, a conductive layer is formed by a sputtering method or the like over the substrate having an insulating surface and the conductive layer is etched, whereby the first electrode 108 can be formed. The first electrode 108 may be formed to have a thickness of approximately from 100 nm to 500 nm.

Then, a film including silicon is formed over the first electrode 108 by a sputtering method, an LPCVD method, a plasma CVD method, or the like, and the film is etched into a desired shape, whereby the film including silicon 109 is formed. As the film including silicon 109, any of a film including amorphous silicon, a film including microcrystalline silicon, and a film including polycrystalline silicon can be used. The film including silicon may have a thickness of from 10 nm to 200 nm. For example, the film including silicon having a thickness of 100 nm is formed by a plasma CVD method, a resist mask is formed over the film including silicon with the use of a photomask, and the film including silicon is selectively etched, whereby the film including silicon 109 can be formed.

Then, a conductive layer is formed over the film including silicon 109 by a sputtering method or the like and the conductive layer is etched, whereby the second electrode 110 can be formed. The second electrode 110 may be formed to have a thickness of approximately from 100 nm to 500 nm.

The memory element 101 can be formed in the manner described above.

In this embodiment mode, the first electrode 108 and the second electrode 110 are formed using different materials. When different materials are used, an energy barrier at the interface between the first electrode 108 and the film including silicon 109 and an energy barrier at the interface between the second electrode 110 and the film including silicon 109 are different from each other, and therefore, a current flow from the first electrode 108 side and a current flow from the second electrode 110 side are different from each other. Accordingly, a voltage value necessary for siliciding the film including silicon 109 is varied depending on a polarity of voltage applied between the electrodes.

For example, a case of using, for example, tungsten (W) as a material for the first electrode and titanium (Ti) as a material for the second electrode is described. First, in the case where the first electrode made of W is an anode and the second electrode made of Ti is a cathode, since the work function of Ti is small, an energy barrier at the interface between the second electrode made of Ti and the film including silicon is small, and thus electrons are easily injected from the second electrode into the film including silicon. Therefore, current flows easily and Joule's heat is easily generated, and accordingly, the film including silicon can be silicided by applying voltage of, for example, approximately 2.5 V. Meanwhile, in the case where the second electrode is an anode and the first electrode is a cathode, since the work function of W is large, an energy barrier at the interface between the first electrode made of W and the film including silicon is large, and thus electrons are not easily injected from the first electrode into the film including silicon. Therefore, current does not flow easily and Joule's heat is not easily generated, and accordingly, the film including silicon can be silicided by applying voltage of, for example, approximately 3.5 V, which is higher than that in the case of using a cathode made of Ti.

Therefore, when voltage of 3 V is applied to the first electrode and voltage of 0 V is applied to the second electrode, silicide reaction between the film including silicon and Ti occurs. However, when voltage of 0 V is applied to the first electrode and voltage of 3 V is applied to the second electrode, silicide reaction between the film including silicon and W does not occur.

Hereinafter, a method for operating a circuit is specifically described. In this embodiment mode, for example, an electrode made of metal which is easily silicided, such as Ti, is provided on the point B side (the second electrode side) of the memory element, and for example, an electrode made of metal such as W is provided on the point A side (the first electrode side) thereof; and the film including silicon is silicided when a voltage value of a HIGH level is applied to the point A side of the memory element and a voltage value of a LOW level is applied to the point B side thereof.

First, circuit operation for writing data into the memory cell is described. In the case where the film including silicon of the memory element 101 of the memory cell 100 is to be silicided, for writing, the first wiring 103 and the second wiring 104 are set to a HIGH (high) level and a voltage value of the high level is used for the gate electrode of the first transistor 106 to turn the first transistor 106 on. The third wiring 105 is set to a LOW (low) level and a voltage value of the low level is used for the gate electrode of the second transistor 107 to turn the second transistor 107 off. Accordingly, the potential at the point A becomes HIGH and the potential at the point B becomes LOW; therefore, the film including silicon is silicided in the memory element 101, and the memory element is brought into a state where the film including silicon is silicided. It is to be noted that a memory cell which is not selected here can be in an initial state in which the film including silicon is not silicided.

Next, circuit operation for reading the data written into the memory cell is described.

In the case where the data written into the memory element is read, the first wiring 103 is set to a floating state, the second wiring 104 is set to a HIGH (high) level, and a voltage value of the high level is used for the gate electrode of the first transistor 106 to turn the first transistor 106 on. Further, the third wiring 105 is set to a HIGH (high) level and the voltage value of the high level is used for the gate electrode of the second transistor 107 to turn the second transistor 107 on.

In the case where the film including silicon of the memory element is not silicided, the potential at the point A becomes LOW and the potential at the point B becomes HIGH. Therefore, the potential of the LOW level is read from the first wiring 103 through the first transistor 106. Accordingly, it can be determined that the memory cell is in an initial state in which the film including silicon is not silicided.

On the other hand, in the case where the film including silicon of the memory element is silicided, the potential at the point A becomes higher than the potential of the LOW level, and the potential at the point A is read from the first wiring 103 through the first transistor 106. Accordingly, it can be determined that the memory cell is in a state where the film including silicon is silicided.

In this embodiment mode, for reading the data written into the memory element, a polarity of voltage applied between electrodes is changed from a polarity of voltage for writing, and a LOW level voltage value is used for the point A side and a HIGH level voltage value is used for the point B side. Therefore, even when the HIGH level voltage value is used for the memory element in the case where data written into the memory element in which the film including silicon is not silicided is read, silicide reaction between the film including silicon and the conductive layer does not occur, and data is not written into the memory element. Therefore, data can be written into and read from the memory element by applying the same voltage value (here, the voltage value of the HIGH level).

In this embodiment mode, since the first electrode and the second electrode which are included in the memory element are formed using different materials, writing and reading can be performed by applying the same voltage value by a simple method in which a polarity of voltage applied to the memory element during reading is changed into a different polarity of voltage for writing. Therefore, the memory element utilizing silicide reaction can be operated by applying the same voltage value for writing and reading. It is not necessary to form a circuit which changes voltage values to be different for writing and for reading, such as a boosting circuit, in a storage device having a memory cell described in this embodiment mode. Accordingly, the scale of a circuit can be drastically reduced and a device can be miniaturized.

In this embodiment mode, a HIGH level voltage value refers to a value between a first voltage value at which the film including silicon is silicided when the first electrode is an anode, and a second voltage value at which the film including silicon is silicided when the second electrode is an anode. Here, the first voltage value is smaller than the second voltage value. By setting a HIGH level voltage value in this manner, silicide reaction between the film including silicon and the conductive layer occurs when the HIGH level voltage value is applied to the point A side of the memory element and a LOW level voltage value is applied to the point B side thereof. However, silicide reaction between the film including silicon and the conductive layer does not occur when a LOW level voltage value is applied to the point A side thereof and a HIGH level voltage value is applied to the point B side thereof. A HIGH level voltage value is not particularly limited as long as the value is between the first voltage value and the second voltage value. Preferably, an approximately intermediate voltage value between the first voltage value and the second voltage value may be applied. A LOW level voltage value is not particularly limited as long as the value is lower than the first voltage value and the second voltage value.

It is to be noted that at least one of the first electrode 108 and the second electrode 110 of the memory element 101 is formed of a film using a material which is able to undergo silicide reaction with silicon, and the first electrode 108 and the second electrode 110 of the memory element are formed using different materials. The film using a material which is able to undergo silicide reaction with silicon can be formed, for example, of a single layer film including an element selected from Ti, W, Ni, Cr, Mo, Ta, Co, Zr, V, Pd, Hf, Pt, and Fe, or an alloy material or a compound material each including any of the elements as a main component; or a stacked layer film of these. In the case where only one of the two electrodes is formed using a material which is able to undergo silicide reaction with silicon, a material for the other electrode is not particularly limited. For example, the other electrode may be formed using a semiconductor material typified by polycrystalline silicon doped with an impurity element such as phosphorus.

It is to be noted that materials for the first electrode 108 and the second electrode 110 of the memory element are not necessarily different from each other completely, and a case is also acceptable in which a state of the interface between the first electrode 108 and the film including silicon 109 and a state of the interface between the second electrode 110 and the film including silicon 109 are different from each other when the electrodes are formed using the same material. In other words, it is acceptable as long as an energy barrier at the interface between the first electrode 108 and the film including silicon 109 and an energy barrier at the interface between the second electrode 110 and the film including silicon 109 are different from each other, and a current flow from the first electrode 108 side and a current flow from the second electrode 110 side are different from each other.

For example, after forming the first electrode 108, an approximately several-nm metal oxide film or metal nitride film may be formed between the first electrode 108 and the film including silicon 109 by oxidizing or nitriding a surface of the first electrode 108. In that case, the metal oxide film or the metal nitride film is formed, whereby current from the first electrode side does not flow easily. Accordingly, the film including silicon can be silicided when a voltage value of a low level is used for the first electrode 108 and a voltage value of a high level is used for the second electrode 110. Further, an approximately several-nm silicon oxide film or silicon nitride film may be formed between the film including silicon 109 and the second electrode 110 by oxidizing or nitriding a surface of the film including silicon 109. In that case, the silicon oxide film or the silicon nitride film is formed, whereby current from the second electrode side does not flow easily. Accordingly, the film including silicon can be silicided when a high level voltage value is used for the first electrode 108 and a low level voltage value is used for the second electrode 110.

In this embodiment mode, the first transistor 106 and the second transistor 107 serve as switches which control a current flow, and the switch which can be used in this embodiment mode is not limited to a transistor. Various kinds of switches such as electrical switches, mechanical switches, and the like can be used, and any element can be used as long as it can control a current flow, without limitation to a certain element. For example, a transistor (e.g., a bipolar transistor or a MOS transistor), a diode (e.g., a PN diode, a PIN diode, a Schottky diode, a MIM (metal insulator metal) diode, a MIS (metal insulator semiconductor) diode, or a diode-connected transistor), a thyristor, or the like can be used as a switch. Alternatively, a logic circuit combining such elements can be used as a switch.

Figure 2:
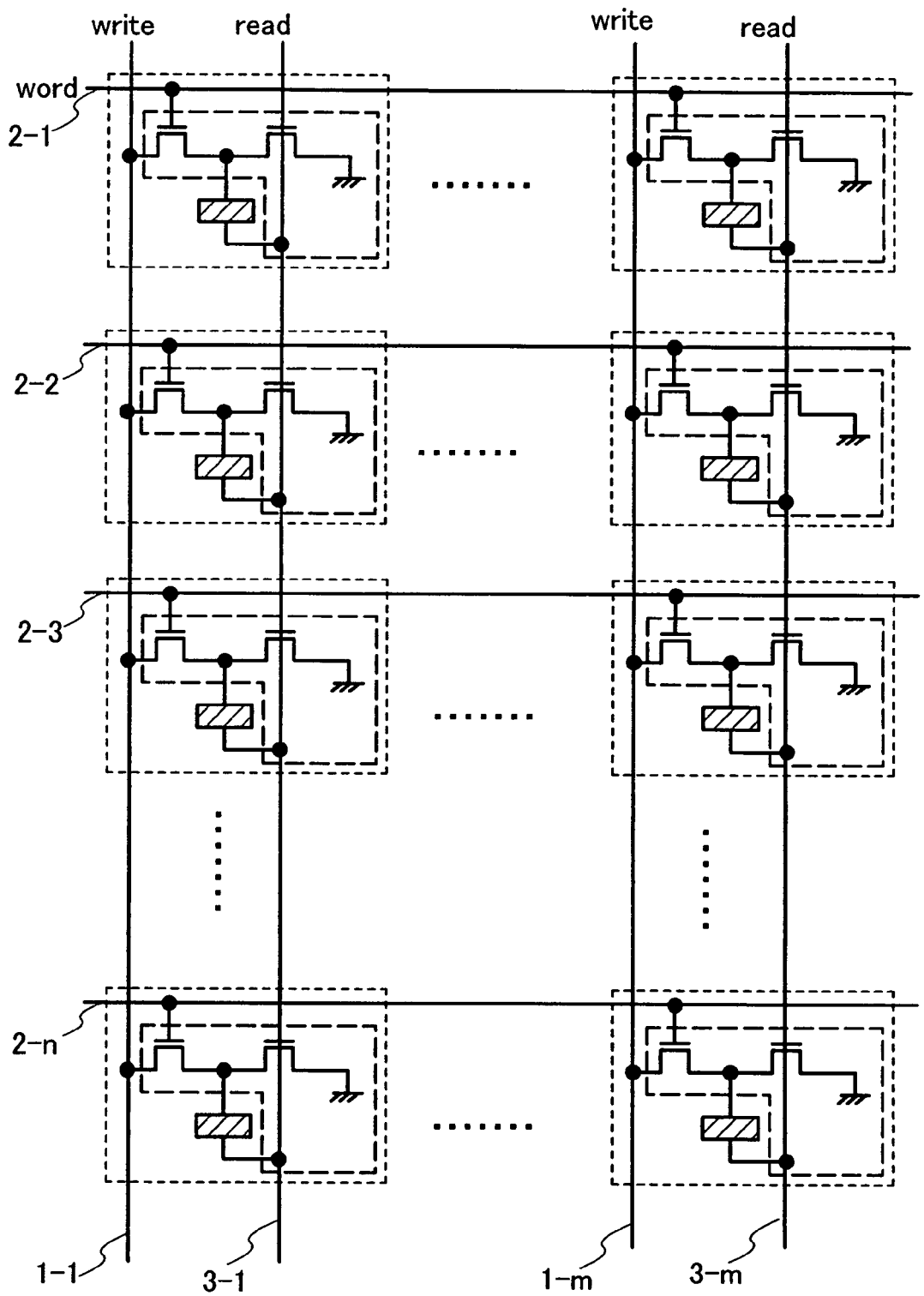
FIG. 2 is a view illustrating a configuration of a storage device of the present invention.

In this embodiment mode, one memory cell is described. However, in the case where memory cells of this embodiment mode are used as a storage device, a structure can be obtained in which a plurality of first wirings, second wirings, and third wirings are provided in a matrix and a memory cell is provided at each intersection thereof. For example, a structure as shown in FIG. 2 is obtained. In FIG. 2, m (m is an integer of two or more) first wirings 1-1 to 1-*m*, n (n is an integer of two or more) second wirings 2-1 to 2-*n*, and m third wirings 3-1 to 3-*m* are provided. A memory cell is provided at each intersection thereof. Each memory cell includes a memory element and a circuit which changes a polarity of voltage applied to the memory element for writing into a different polarity of that for reading. In each memory cell, "a state where the film including silicon is silicided" or "an initial state" is appropriately stored, whereby the memory cells can be used as a storage device capable of storing various data.

Embodiment Mode 2

In this embodiment mode, a memory cell having a structure is described, which changes a polarity of voltage applied to the memory element for writing data into the memory element (or for reading the data written into the memory element) into a different polarity for reading (or writing). Specifically, a circuit configuration different from that described in Embodiment Mode 1, which changes a polarity of voltage applied between electrodes of a memory element, is described.

First, a structure of a memory cell of this embodiment mode is described with reference to drawings.

Figure 3:
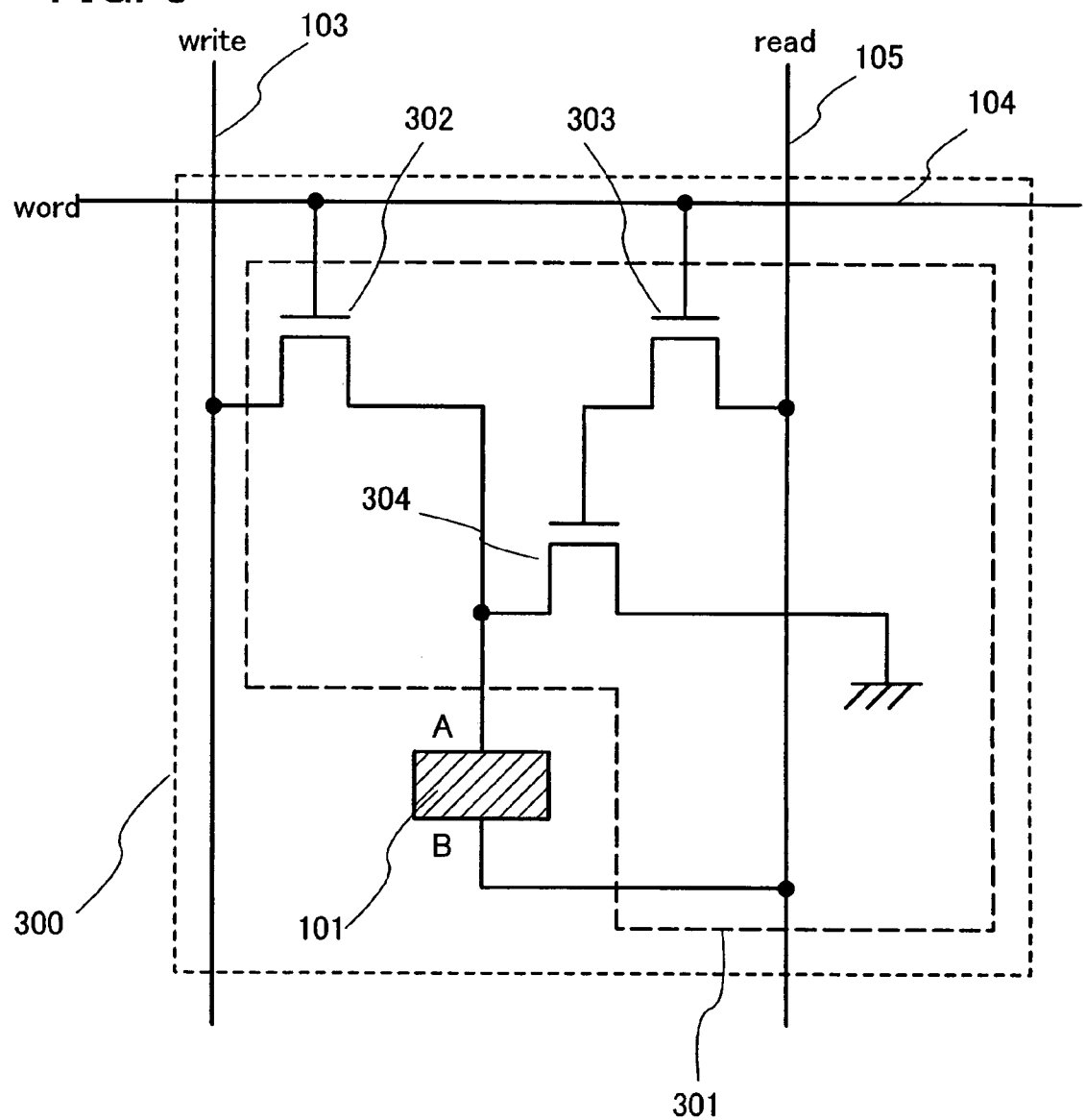
FIG. 3 is a view illustrating a configuration of a memory cell of the present invention.

FIG. 3 shows a schematic view of a circuit configuration of a memory cell of an embodiment mode of the present invention. A memory cell 300 of this embodiment mode includes a memory element 101; a circuit 301 which changes a polarity of voltage applied to the memory element for writing (or reading) into a different polarity for reading (or writing); a first wiring 103; a second wiring 104, and a third wiring 105. In this embodiment mode, the circuit 301 includes a first transistor 302, a second transistor 303, and a third transistor 304. An element or a wiring which are similar to that described in Embodiment Mode 1 can be used for the memory element 101, the first wiring 103, the second wiring 104, and the third wiring 105. The memory element 101 has a stacked layer structure of the first electrode 108, the film including silicon 109, and the second electrode 110 in this order from the point A side as shown in FIG. 1B. Further, in this embodiment mode, polarities of the first transistor 302, the second transistor 303, and the third transistor 304 are set to be n-channel type.

In the memory cell shown in FIG. 3, a first electrode of the first transistor 302 is connected to the first wiring 103, and a gate electrode of the first transistor 302 is connected to the second wiring 104. A second electrode of the first transistor 302 is electrically connected to a first electrode of the third transistor 304 and the first electrode 108 of the memory element 101. A gate electrode of the third transistor 304 is electrically connected to a first electrode of the second transistor 303, and a second electrode of the third transistor 304 is grounded. A gate electrode of the second transistor 303 is electrically connected to the second wiring 104, and a second electrode of the second transistor 303 is electrically connected to the third wiring 105. The second electrode 110 of the memory element 101 is connected to the third wiring 105.

Next, operation of the memory cell of this embodiment mode is described.

First, circuit operation for writing data into the memory cell is described. In this embodiment mode, metal which is easily silicided is provided on the point A side (the first electrode side) of the memory element, and the film including silicon is silicided when a voltage value of a HIGH level is applied to the point A side of the memory element and a voltage value of a LOW level is applied to the point B side thereof.

In the case where the film including silicon of the memory element 101 of the memory cell 300 is to be silicided, for writing, the first wiring 103 is set to a HIGH (high) level and the second wiring 104 is set to a LOW level, and a voltage value of the high level is used for the gate electrode of the first transistor 302 to turn the first transistor 302 on; the voltage value of the high level is used for the gate electrode of the second transistor 303 to turn the second transistor 303 on; and a voltage value of the low level is used for the gate electrode of the third transistor 304 to turn the third transistor 304 off. Accordingly, the potential at the point A becomes HIGH and the potential at the point B becomes LOW; therefore, the memory element 101 is brought into a state where the film including silicon is silicided. It is to be noted that a memory cell which is not selected here can be an initial state in which the film including silicon is not silicided.

Next, circuit operation for reading the data written into the memory cell is described.

In the case where the data written into the memory element is read, the first wiring 103 is set to a floating state, the second wiring 104 and the third wiring 105 are set to a HIGH (high) level, and the voltage value of the high level is used for the gate electrode of the first transistor 302 to turn the first transistor 302 on. Further, the voltage value of the high level is used for the gate electrode of the second transistor 303 to turn the second transistor 303 on; and the voltage value of the high level is used for the gate electrode of the third transistor 304 to turn the third transistor 304 on.

In the case where the film including silicon of the memory element is not silicided, the potential at the point A becomes LOW and the potential at the point B becomes HIGH. Therefore, the potential of the LOW level is read from the first wiring 103. Accordingly, it can be determined that the memory cell is in an initial state in which the film including silicon of the memory element is not silicided.

On the other hand, in the case where the film including silicon of the memory element is silicided, the potential at the point A becomes higher than the potential of the LOW level, and the potential at the point A is read from the first wiring 103. Accordingly, it can be determined that the memory cell is in a state where the film including silicon is silicided.

In this embodiment mode, for reading the data written into the memory element, a polarity of applying voltage between electrodes is changed from a polarity of that for writing, and thus a voltage value of a LOW level is used for the point A side and a voltage value of a HIGH level is used for the point B side. Therefore, even when a voltage value of the HIGH level is used for the memory element in the case where the data written into the memory element in which the film including silicon is not silicided is read, silicide reaction between the film including silicon and the conductive layer does not occur, and data is not written into the memory element. Therefore, data can be written into and read from the memory element with the use of the same voltage value (here, the voltage value of the HIGH level).

The memory cell 300 in this embodiment mode includes the memory element 101 in which the first electrode and the second electrode are formed using different materials, and the circuit 301 which reveres a polarity of applying voltage to the memory element for writing (or reading) into a direction at the time of reading (or writing), whereby writing and reading can be performed with the use of the same voltage value.

In this embodiment mode, by providing the second transistor 303, voltage can be applied to the memory element 101 only when the second transistor 303 is turned on. Therefore, application of voltage to the memory element which is not selected can be prevented, and the memory cell can be operated with higher accuracy.

In this embodiment mode, since the first electrode and the second electrode which are included in the memory element are formed using different materials, writing and reading can be performed by applying the same voltage value by a simple method in which a polarity of voltage applied to the memory element for of writing or reading is changed into a different polarity for reading or writing, respectively. Therefore, the memory element utilizing silicide reaction can be operated with the use of the same voltage value for writing and for reading. It is not necessary to form a circuit in which different voltage values are used for writing and for reading, such as a boosting circuit, in a storage device having a memory cell described in this embodiment mode. Accordingly, the scale of a circuit can be drastically reduced and a device can be miniaturized.

In this embodiment mode, the first transistor 302, the second transistor 303, and the third transistor 304 serve as switches which control a current flow, and the switch which can be used in this embodiment mode is not limited to a transistor. Various kinds of switches such as electrical switches, mechanical switches, and the like can be used, and any element can be used as long as it can control a current flow, without limitation to a certain element. For example, a transistor (e.g., a bipolar transistor or a MOS transistor), a diode (e.g., a PN diode, a PIN diode, a Schottky diode, a MIM (metal insulator metal) diode, a MIS (metal insulator semiconductor) diode, or a diode-connected transistor), a thyristor, or the like can be used as a switch. Alternatively, a logic circuit combining such elements can be used as a switch.

Embodiment Mode 3

In this embodiment mode, an example of a manufacturing step of a semiconductor device having a memory cell described in the above embodiment mode is described with reference to FIGS. 4A to 5C. In this embodiment mode, a manufacturing step of a wireless chip capable of communicating with outside wirelessly through an antenna is described as an example of a semiconductor device.

First, a metal layer 502 to be a separation layer is formed over a substrate 501. As the substrate 501, a quartz substrate, a glass substrate, or the like can be used. In particular, a glass substrate that can have a large area with a side of 1 m or more of the substrate is suitable for mass production. As the metal layer 502, a tungsten film, a tungsten nitride film, or a molybdenum film with a thickness of 30 to 200 nm obtained by a sputtering method can be used.

Next, a surface of the metal layer 502 is oxidized to form a metal oxide layer (not shown). The metal oxide layer may be formed by oxidation of the surface with pure water or ozone water or oxidation with oxygen plasma. Alternatively, the metal oxide layer may be formed by heating in an atmosphere containing oxygen. Further alternatively, the metal oxide layer may be formed in a later step of forming an insulating film. In this case, when a silicon oxide film or a silicon oxynitride film is formed as the insulating film by a plasma CVD method, the surface of the metal layer 502 is oxidized, so that the metal oxide layer is formed.

Next, a first insulating film 503 is formed over the metal oxide layer. An insulating film such as a silicon oxide film, a silicon nitride film, or a silicon oxynitride film ($SiO_xN_y$) is used as the first insulating film 503. As a typical example, the first insulating film 503 is formed of a two-layer structure, and a structure is employed in which a silicon nitride oxide film with a thickness of 50 to 100 nm formed by a PCVD method using $SiH_4$, $NH_3$, and $N_2O$ as reactive gases and a silicon oxynitride film with a thickness of 100 to 150 nm using $SiH_4$ and $N_2O$ as reactive gases are stacked. Alternatively, as one layer of the first insulating film 503, a silicon nitride film (SiN film) with a thickness of less than or equal to 10 nm or a silicon oxynitride film ($SiN_xO_y$ film (X>Y)) with a thickness of less than or equal 10 nm is preferably used. Alternatively, a three-layer structure may be employed in which a silicon nitride oxide film, a silicon oxynitride film, and a silicon nitride film are sequentially stacked. Although the example is described here in which the first insulating film 503 is formed as a base insulating film, the first insulating film 503 is not necessarily provided if it is not needed.

Next, a semiconductor layer is formed over the first insulating film 503. The semiconductor layer is formed as follows: a semiconductor film having an amorphous structure is formed by a known method (a sputtering method, an LPCVD method, a plasma CVD method, or the like), and then crystallized by known crystallization treatment (laser crystallization, thermal crystallization, thermal crystallization using a catalyst such as nickel, or the like) to obtain a crystalline semiconductor film, and the crystalline semiconductor film is patterned into a desired shape after a resist mask is formed as a first photomask, over the crystalline semiconductor film. Note that if a plasma CVD method is used, the first insulating film and the semiconductor film having an amorphous structure can be consecutively stacked without being exposed to the air. This semiconductor film is formed to have a thickness of 25 to 80 nm (preferably 30 to 70 nm). Although there is no limitation on a material of the amorphous semiconductor film, silicon or a silicon germanium (SiGe) alloy is preferably used for forming the amorphous semiconductor film.

Alternatively, for crystallization treatment of the semiconductor film having an amorphous structure, a continuous wave laser may be used. In order to obtain a crystal with a large grain size in crystallization of the amorphous semiconductor film, second to fourth harmonics of the fundamental wave is preferably employed using a solid laser capable of continuous wave oscillation. Typically, the second harmonic (532 nm) or the third harmonic (355 nm) of an Nd:YVO$_4$ laser (fundamental wave of 1064 nm) may be employed. When a continuous wave laser is used, laser light emitted from a continuous wave YVO$_4$ laser whose output power is 10 W is converted into a harmonic by a non-linear optical element. In addition, there is a method by which YVO$_4$ crystal and a non-linear optical element are put in an oscillator and a harmonic is emitted. Then, the laser light is preferably shaped into a rectangular or elliptical shape on an irradiation surface by an optical system and is emitted to the semiconductor film. At this time, energy density of about 0.01 to 100 MW/cm$^2$ (preferably, 0.1 to 10 MW/cm$^2$) is needed. Then, the semiconductor film may be moved at a speed of about 10 to 2000 cm/s relatively to the laser light so as to be irradiated.

Next, the resist mask is removed. Then, if necessary, the semiconductor layer is doped with a small amount of impurity elements (boron or phosphorus) in order to control a threshold of a TFT. Here, an ion doping method is employed in which diborane (B$_2$H$_6$) is not separated by mass but excited by plasma.

Next, a surface of the semiconductor layer is washed at the same time as removal of an oxide film on the surface of the semiconductor layer with an etchant containing hydrofluoric acid.

Then, a second insulating film which covers the semiconductor layer is formed. The second insulating film is formed to have a thickness of 1 to 200 nm by a plasma CVD method or a sputtering method. The second insulating film is preferably formed to be as thin as 10 to 50 nm to have a single layer or stacked layer structure of an insulating film containing silicon, and then surface nitridation treatment using plasma with a microwave is performed. The second insulating film functions as a gate insulating film of a TFT to be formed later.

Next, gate electrodes 504 to 508 and a first electrode 509 which serves as a lower electrode of the memory element are formed over the second insulating film. A resist mask is formed using a second photomask, and then a conductive film with a thickness of 100 to 500 nm which is obtained by a sputtering method is patterned into a desired shape, so that the gate electrodes 504 to 508 and the first electrode 509 are formed.

It is acceptable as long as a material of the gate electrodes 504 to 508 and the first electrode 509 is a material being able to undergo silicide reaction with silicon. The gate electrodes 504 to 508 and the first electrode 509 may be formed of a single layer of an element selected from Ti, W, Ni, Cr, Mo, Ta, Co, Zr, V, Pd, Hf, Pt, and Fe, or an alloy material or a compound material containing the element as its main component, or a stacked layer thereof. Note that a high melting point metal is preferably used for the gate electrode of the TFT; thus, W or Mo is preferably used. In the case where the gate electrodes 504 to 508 and the first electrode 509 are formed of a stacked layer, if a material layer which serves as an upper layer is formed using the above-described material, a material layer which serves as a lower layer may be a polycrystalline silicon layer doped with an impurity element such as phosphorus.

Next, a resist mask is formed using a third photomask so as to cover the semiconductor layers in regions to be p-channel TFTs, and an impurity element is introduced to the semiconductor layers in regions to be n-channel TFTs, using the gate electrodes 505 and 507 as masks, so that low concentration impurity regions are formed. As the impurity element, an impurity element imparting n-type conductivity or an impurity element imparting p-type conductivity can be used. As the impurity element imparting n-type conductivity, phosphorus (P), arsenic (As), or the like can be used. Here, phosphorus (P) is introduced to the semiconductor layer in the regions to be the n-channel TFTs so as to be contained at concentrations of $1\times10^{15}$ to $1\times10^{19}$ atoms/cm$^3$, so that n-type impurity regions are formed.

Next, the resist mask is removed. A resist mask is formed using a fourth photomask so as to cover the semiconductor layers in the regions to be the n-channel TFTs, and an impurity element is introduced to the semiconductor layers in the regions to be the p-channel TFTs, using the gate electrodes 504, 506, and 508 as masks, so that p-type impurity regions are formed. As the impurity element imparting p-type conductivity, boron (B), aluminum (Al), gallium (Ge), or the like can be used. Here, boron (B) is introduced to the semiconductor layer in the regions to be the p-channel TFTs so as to be contained at concentrations of $1\times10^{19}$ to $1\times10^{20}$ atoms/cm$^3$, so that the p-type impurity regions can be formed. Consequently, source or drain regions 514 and 515 and a channel formation region 516 are formed in the semiconductor layer in the region to be the p-channel TFT.

Next, sidewalls 510 and 511 are formed on both side surfaces of the gate electrodes 504 to 508 and the first electrode 509. A formation method of the sidewalls 510 is as follows. First, a film containing an inorganic material such as silicon, an oxide of silicon, or a nitride of silicon, or a film containing an organic material such as an organic resin is formed by a plasma CVD method, a sputtering method, or the like to have a single layer or a stacked layer so as to cover the second insulating film, the gate electrodes 504 to 508, and the first electrode 509; accordingly, a third insulating film is formed. Then, the third insulating film is selectively etched by anisotropic etching mainly in a perpendicular direction to form insulating films (the sidewalls 510) which are in contact with the side surfaces of the gate electrodes 504 to 508 and the first electrode 509. Note that part of the second insulating film is etched to be removed at the same time as the formation of the sidewalls 510. Part of the second insulating film is removed, so that a remaining gate insulating layer 512 is formed below each of the gate electrodes 504 to 508 and the sidewalls 510. In addition, part of the second insulating film is removed, so that a remaining insulating layer 513 is formed below the first electrode 509 and the sidewalls 511.

Next, a resist mask is formed using a fifth photomask so as to cover the semiconductor layers to be the p-channel TFTs, and an impurity element is introduced to the semiconductor layers in the regions to be the n-channel TFTs, using the gate electrodes 505 and 507 and the sidewalls 510 as masks, so that high concentration impurity regions are formed. The resist mask is removed after the impurity element is introduced. Here, phosphorus (P) is introduced to the semiconductor layer in the regions to be the n-channel TFTs so as to be contained at concentrations of $1\times10^{19}$ to $1\times10^{20}$ atoms/cm$^3$, so that n-type high concentration impurity regions can be formed. Consequently, source or drain regions 517 and 518, LDD regions 519 and 520, and a channel formation region 521 are formed in the semiconductor layer in the region to be the n-channel TFT. The LDD regions 519 and 520 are formed below the sidewalls 510.

Although the structure is described in which the LDD regions are formed in the semiconductor layer included in the n-channel TFT and LDD regions are not formed in the semiconductor layer included in the p-channel TFT, the present invention is not limited thereto. The LDD regions may be formed in the semiconductor layers included in both the n-channel TFT and the p-channel TFT.

Next, a fourth insulating film 522 containing hydrogen is formed by a sputtering method, an LPCVD method, a plasma CVD method, or the like, and then activation treatment and hydrogenation treatment of the impurity element added to the semiconductor layer are performed. Heat treatment (at 300 to 550° C. for 1 to 12 hours) in a furnace or a rapid thermal annealing method (RTA method) using a lamp light source is used for the activation treatment and hydrogenation treatment of the impurity element. A silicon nitride oxide film (SiNO film) obtained by a PCVD method is used for the fourth insulating film 522 containing hydrogen. Here, a thickness of the fourth insulating film 522 containing hydrogen is 50 to 200 nm. Besides, in the case where the semiconductor film is crystallized using a metal element which promotes crystallization, typically nickel, gettering which reduces nickel in the channel formation region can also be performed at the same time as the activation. Note that the fourth insulating film 522 containing hydrogen is a first layer of an interlayer insulating film.

Next, a fifth insulating film 523 which serves as a second layer of the interlayer insulating film is formed by a sputtering method, an LPCVD method, a plasma CVD method, or the like. A single layer or a stacked layer of an insulating film such as a silicon oxide film, a silicon nitride film, or a silicon oxynitride film is used for the fifth insulating film 523. Here, a thickness of the fifth insulating film 523 is 300 to 800 nm.

Next, a resist mask is formed over the fifth insulating film 523, using a sixth photomask, and the fourth insulating film 522 and the fifth insulating film 523 are selectively etched, so that a first opening reaching the first electrode 509 is formed. The resist mask is removed after the etching. A diameter of the first opening is preferably about 1 to 6 μm. In this embodiment mode, the diameter of the first opening is 2 μm.

A cross-sectional view of a semiconductor device manufactured through the preceding steps corresponds to FIG. 4A.

Next, a silicon film, as a film including silicon, is formed by a sputtering method, an LPCVD method, a plasma CVD method, or the like. Any one of an amorphous silicon film, a microcrystalline silicon film, and a polycrystalline silicon film is used as the silicon film, and a thickness of the silicon film is 10 to 200 nm. In this embodiment mode, a silicon film with a thickness of 100 nm is formed by a plasma CVD method. Then, a resist mask is formed over the silicon film, using a seventh photomask, and the silicon film is selectively etched, so that a silicon layer 524 which overlaps with the first opening is formed. The resist mask is removed after the etching.

A cross-sectional view of the semiconductor device manufactured through the preceding steps corresponds to FIG. 4B.

Next, a resist mask is formed using an eighth photomask, and the fourth insulating film 522 and the fifth insulating film 523 are selectively etched, so that a contact hole reaching the semiconductor layer, a contact hole reaching the gate electrode, and a second opening reaching the first electrode 509 are formed. The resist mask is removed after the etching.

A cross-sectional view of the semiconductor device manufactured through the preceding steps corresponds to FIG. 4C.

Next, an oxide film on an exposed surface of the semiconductor layer and an exposed surface of the first electrode is removed with an etchant containing hydrofluoric acid, and at the same time, the exposed surface of the semiconductor layer and the exposed surface of the first electrode 109 are washed.

Next, a conductive film is formed by a sputtering method. This conductive film is formed of a single layer of an element selected from Ti, W, Ni, Cr, Mo, Ta, Co, Zr, V, Pd, Hf, Pt, Fe, Al, and Cu, or an alloy material or a compound material containing the element as its main component, or a stacked layer thereof. Note that in the case where the conductive film is stacked, at least one layer which is in contact with the silicon layer 524 is formed using a material being able to undergo silicide reaction with silicon and is different from a material (W in this embodiment mode) used for forming the first electrode 509 which serves as a lower electrode of a memory element. For example, a three-layer structure of a Ti film, an Al film containing a minute amount of silicon, and a Ti film or a three-layer structure of a Ti film, an Al alloy film containing Ni and C, and a Ti film is employed. In this embodiment mode, three layers of a Ti film with a thickness of 100 nm, a pure Al film with a thickness of 350 nm, and a Ti film with a thickness of 100 nm are stacked.

Next, a resist mask is formed using a ninth photomask, and the conductive film is selectively etched, so that source or drain electrodes 525 to 534, gate lead wirings 535 to 539, a second electrode 540 and a third electrode 541 of the memory element, and a fourth electrode 542 of an antenna portion are formed. The second electrode 540 overlaps with the first opening to serve as an upper electrode of the memory element. In addition, the third electrode 541 overlaps with the second opening to be electrically connected to the first electrode 509. Note that although not shown here, the fourth electrode 542 is electrically connected to a TFT of an antenna portion and power supply portion. The resist mask is removed after the etching.

A cross-sectional view of the semiconductor device manufactured through the preceding steps corresponds to FIG. 4D. In this embodiment mode, TFTs of a logic circuit portion, a TFT and a memory element 600 of a storage device portion, and TFTs of the antenna portion and power supply portion can be formed over the same substrate with the use of nine photomasks.

Next, a sixth insulating film 543 which covers the TFTs of a logic circuit portion 601, the TFT and the memory element 600 of a storage device portion 602, and the TFTs of an antenna portion and power supply portion 603 is formed. An insulating film containing silicon oxide or an organic resin film is used as the sixth insulating film 543. The insulating film containing silicon oxide is preferably used for improving reliability of a wireless chip. Alternatively, an organic resin film formed by a coating method is preferably used because the sixth insulating film 543 desirably has a planarized surface in the case where an antenna to be formed later is formed by a screen printing method. The film used as the sixth insulating film 543 may be appropriately selected by practitioners. Moreover, in this embodiment mode, the example is described in which the antenna to be formed later overlaps with a driver circuit and the storage device portion, and thus, the sixth insulating film 543 functions as an interlayer insulating film which isolates the driver circuit and the storage device portion from the antenna. In the case where the antenna has a circular shape (e.g., a loop antenna) or a spiral shape, one of both ends of the antenna is led by a wiring of a lower layer; thus, it is preferable to provide the sixth insulating film 543. Note that in the case where a microwave method is employed and the antenna has a linear shape (e.g., a dipole antenna), a flat shape (e.g., a patch antenna), or the like, the antenna to be formed later can be arranged so as not to overlap with the driver circuit and the storage device portion; thus, the sixth insulating film 543 need not to be provided.

Next, a resist mask is formed using a tenth photomask, and the sixth insulating film 543 is selectively etched, so that a third opening reaching the third electrode 541 and a fourth opening reaching the fourth electrode 542 are formed. The resist mask is removed after the etching.

A cross-sectional view of the semiconductor device manufactured through the preceding steps corresponds to FIG. 5A.

Next, a metal film is formed over the sixth insulating film 543. A single layer formed using an element selected from Ti, Ni, and Au or a stacked layer thereof is used as the metal film. Then, a resist mask is formed using an eleventh photomask, and the metal film is selectively etched, so that a lead wiring 544 is formed in a lead wiring portion 604 of the first electrode and a base film 545 of the antenna is formed. Note that, here, the lead wiring 544 and the base film 545 can be selectively formed by a sputtering method using a metal mask without using the resist mask, as well. When the base film 545 of the antenna is provided, a large contact area with the antenna can be secured. Moreover, the lead wiring 544 need not to be formed depending on a layout of a circuit design.

A cross-sectional view of the semiconductor device manufactured through the preceding steps corresponds to FIG. 5B.

Next, an antenna 546 is formed over the base film 545. The antenna 546 can be formed by a screen printing method, or the antenna 546 can be formed in such a manner that a metal film formed using Al, Ag, or the like is formed by a sputtering method and then patterned using a photomask. If reduction in the number of photomasks is prioritized, the antenna may be formed by a screen printing method. A screen printing method refers to a method in which an ink or a paste, which is provided on a screen plate formed in such a manner that a predetermined pattern is formed by a photosensitive resin on a base made of a metal mesh or a high polymer fiber mesh, is transferred to a work which is placed on the opposite side of the screen plate, with the use of a rubber, plastic, or metal blade which is called a squeegee. A screen printing method has a merit that pattern formation in a comparatively large area is realized at low cost.

In the case of forming the antenna 546 by a screen printing method or an ink jet method, a conductive paste in which conductive particles with a grain diameter of several nm to several tens μm are dissolved or dispersed in an organic resin is selectively printed, and then, baking for reducing electric resistance is performed.

As the conductive particles, metal particles of one or more kinds of silver (Ag), gold (Au), copper (Cu), nickel (Ni), platinum (Pt), palladium (Pd), tantalum (Ta), molybdenum (Mo), titanium (Ti), and the like, fine particles of silver halide, or dispersant nanoparticles can be used. In addition, as the organic resin contained in the conductive paste, one or more of organic resins selected from organic resins which function as a binder, a solvent, a dispersing agent, and a coating member for the metal particles can be used. Typically, an organic resin such as an epoxy resin or a silicone resin can be used. Further, when the conductive film is formed, baking may be preferably performed after the conductive paste is applied. For example, in the case where fine particles containing silver as its main component (e.g., a grain size of greater than or equal to 1 nm and less than or equal to 100 nm) are used for a material of the conductive paste, a conductive film can be obtained by baking of the paste at temperatures of 150 to 300° C. so as to be cured. Alternatively, fine particles containing solder or lead-free solder as its main component may be used. In that case, fine particles having a grain size of less than or equal to 20 μm are preferably used. Solder and lead-free solder have an advantage of being low cost. In the case of forming the antenna 546 by a screen printing method, the metal layer may be provided as a base film when adhesion of the antenna 546 with the base film 545 is low.

There is no particular limitation on a shape of the antenna 546. As a transmission method of a signal applied to the antenna, an electromagnetic coupling method, an electromagnetic induction method, a microwave method, or the like can be employed. The transmission method may be appropriately selected by a practitioner in consideration of applications, and an antenna having an optimal length and shape may be provided in accordance with the transmission method.

For example, in the case of employing an electromagnetic coupling method or an electromagnetic induction method (e.g., 13.56 MHz band) as the transmission method, electromagnetic induction by change of the electric field density is utilized; therefore, a conductive film functioning as an antenna is formed into a circular shape (such as a loop antenna) or a spiral shape (e.g., a spiral antenna).

In the case of employing a microwave method (e.g., a UHF band (860 to 960 MHz band), a 2.45 GHz band, or the like) as the transmission method, a length or a shape of the conductive film functioning as an antenna may be appropriately set in consideration of the wavelength of an electric wave used for signal transmission. The conductive film functioning as an antenna can be formed in, for example, a linear shape (e.g., a dipole antenna), a flat shape (e.g., a patch antenna), and the like. The shape of the conductive film functioning as an antenna is not limited to a linear shape, and the conductive film functioning as an antenna may be formed in a curved-line shape, a meander shape, or a combination thereof, in consideration of the wavelength of the electromagnetic wave.

Figure 6A:
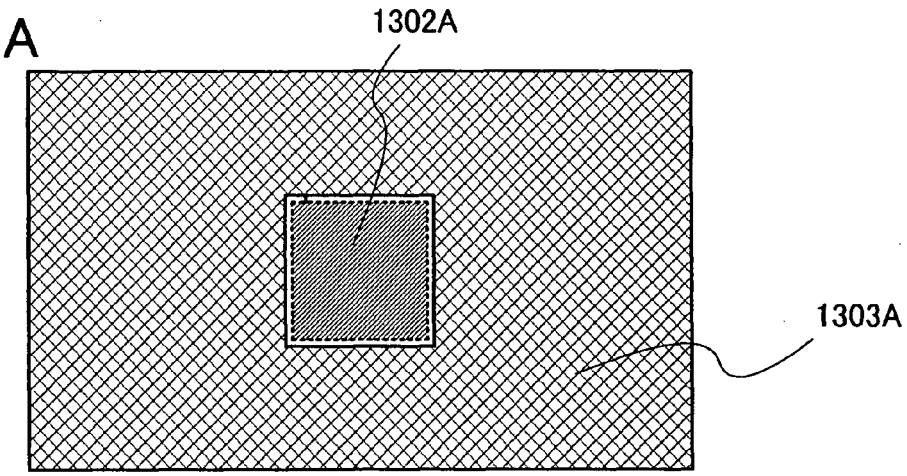
FIGS. 6A to 6E are views each illustrating an example of an antenna which can be used for the present invention.
Figure 6B:
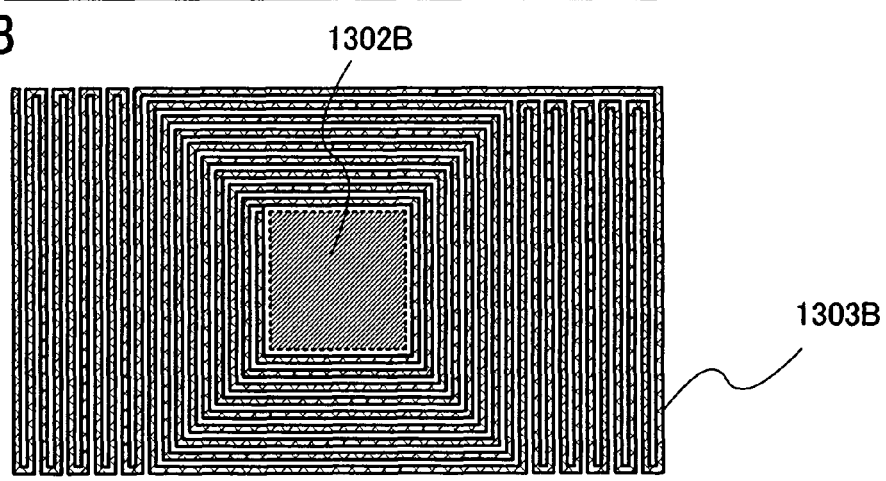
Figure 6C:
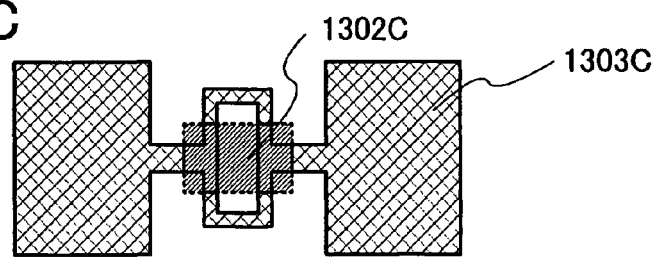
Figure 6D:
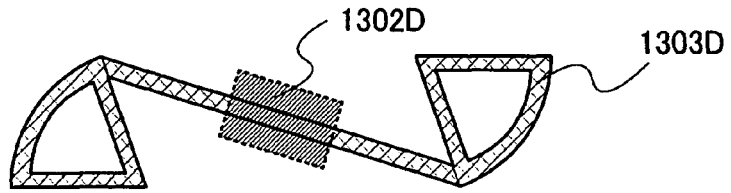
Figure 6E:
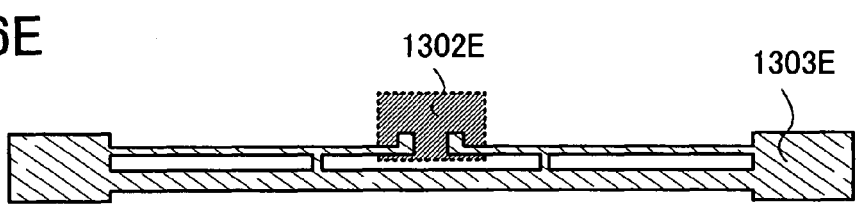

Here, FIGS. 6A to 6E show examples of shapes of the antenna. For example, as shown in FIG. 6A, an antenna 1303A may be provided all around a storage device portion and driver circuit 1302A. As shown in FIG. 6B, a thin antenna 1303B may be provided around a storage device portion and driver circuit 1302B so as to circle around the storage device portion and driver circuit 1302B. As shown in FIG. 6C, the antenna may have a shape like an antenna 1303C for receiving a high-frequency electromagnetic wave with respect to a storage device portion and driver circuit 1302C. As shown in FIG. 6D, the antenna may have a shape like an antenna 1303D which is 180° omnidirectional (capable of receiving signals in any direction) with respect to a storage device portion and driver circuit 1302D. As shown in FIG. 6E, the antenna may have a shape like an antenna 1303E which is extended to be long like a stick with respect to a storage device portion and driver circuit 1302E. The antenna 546 may be used in combination with the antennas with these shapes.

A length needed for the antenna is different depending on frequency used for reception. For example, in the case where the frequency is 2.45 GHz, if a half-wave dipole antenna is provided, the antenna may have a length of about 60 mm (½ wavelength), and if a monopole antenna is provided, the antenna may have a length of about 30 mm (¼ wavelength).

A cross-sectional view of the semiconductor device manufactured through the preceding steps corresponds to FIG. 5C. In this embodiment mode, the TFTs of the logic circuit portion 601, the TFTs and the memory element 600 of the storage device portion 602, and the TFTs and the antenna of the antenna portion and power supply portion 603 can be formed over the same substrate with the use of eleven photomasks.

In the case where the lead wiring 544 and the base film 545 are selectively formed by a sputtering method using a metal mask, a wireless chip shown in FIG. 5C can be formed using ten photomasks. In the case where a microwave method is employed and an antenna has a linear shape, a flat shape, or the like, the formation of the sixth insulating film 543 and the base film 545 of the antenna can be omitted; thus, the wireless chip can be formed using nine photomasks. Furthermore, if a driver circuit is designed and manufactured using only a p-channel TFT in order to reduce the number of photomasks, two photomasks become unnecessary, and the wireless chip can be formed using seven photomasks in total.

In addition, although the example in which the resist mask is formed using the photomask is described in this embodiment mode, there is no particular limitation on the patterning technique. The resist mask may be formed in such a manner that a resist material is selectively formed by a droplet discharging method without using the photomask.

Next, the metal layer 502 and the substrate 501 are removed by separation. Separation is generated inside a metal oxide film, at the interface between the first insulating film 503 and the metal oxide film, or the interface between the metal oxide film and the metal layer 502, so that the wireless chip can be separated from the substrate 501 with relatively less force. When the metal layer 502 and the substrate 501 are removed, a fixed substrate to be bonded on the side where the antenna is provided may be used.

Next, one sheet over which countless wireless chips are formed is divided by a cutter, dicing, or the like so as to be divided into individual pieces. In addition, if a method in which each wireless chip is picked up to be separated is employed, this dividing step is not needed.

Next, the wireless chip is fixed to a sheet-like substrate. For the sheet-like substrate, plastic, paper, a prepreg, a ceramic sheet, or the like can be used. The wireless chip may be fixed so as to be interposed between two sheet-like substrates, or the wireless chip may be fixed to one sheet-like substrate with an adhesive layer. For the adhesive layer, various curable adhesives such as a photo curable adhesive such as a reactive curable adhesive, a thermosetting adhesive, or an ultraviolet curable adhesive; or an aerobic adhesive can be used. Alternatively, the wireless chip can be arranged in the middle of making paper, thereby being provided inside one piece of paper.

With the use of the wireless chip manufactured through the preceding steps, a rewritable memory in which writing can be performed after manufacturing the wireless chip can be realized. For example, data can be written into the memory element included in the wireless chip after the wireless chip fixed to a flexible sheet-like substrate is attached to an object having a curved surface.

The semiconductor device of this embodiment mode includes a memory element in which a silicon film is interposed between a first electrode and a second electrode formed using a material different from the first electrode, and a circuit which changes a polarity of applying voltage to the memory element for writing (or reading) into a different polarity of that for reading (or writing). Therefore, the memory element utilizing silicide reaction can be operated with using the same voltage value for writing and for reading. The semiconductor device described in this embodiment mode has no necessity to be provided with a circuit which changes voltage values to be different for writing and for reading, such as a boosting circuit. Accordingly, the scale of a circuit can be drastically reduced and a device can be miniaturized.

Embodiment Mode 4

In this embodiment mode, a manufacturing step of a wireless chip of which a process is partly different from that in Embodiment Mode 3 is described with reference to FIGS. 7A to 8C.

First, in the same manner as shown FIG. 4A in Embodiment Mode 3, manufacturing is conducted up to a portion shown in FIG. 7A.

Next, a silicon film is formed by a sputtering method, an LPCVD method, a plasma CVD method, or the like, and a metal film is stacked thereover by a sputtering method or a plasma CVD method. Any one of a silicon film, a microcrystalline silicon film, and a polycrystalline silicon film is used as the silicon film. A thickness of the silicon film is 10 to 200 nm. The metal film is formed using a simple substance such as Ti, W, Ni, Cr, Mo, Ta, Co, Zr, V, Pd, Hf, Pt, or Fe, or an alloy or a compound thereof to have a thickness of 10 to 100 nm. Note that the metal film is formed using a material different from a material used for forming a first electrode 509 which serves as a lower electrode of a memory element. In this embodiment mode, a silicon film with a thickness of 50 nm and a titanium nitride film with a thickness of 100 nm are consecutively stacked by a sputtering method without being exposed to the air. That is, in this embodiment mode, in a storage device portion, the silicon layer and the first electrode are not consecutively stacked, whereas the silicon layer and a second electrode are consecutively stacked. In addition, the metal film may be a stacked layer, for example, a stacked layer of a Ti film and a titanium nitride film. Although the step of exposing the silicon layer 524 is described in Embodiment Mode 3 (as shown in FIG. 4B), the silicon layer 524 is protected by the consecutive formation of the metal film in this embodiment mode. In particular, although it is not necessary to consecutively form the silicon layer and the second electrode, in the case where the silicon layer 524 has a thickness of less than or equal to 50 nm, reduction in thickness of the silicon layer 524 due to washing with hydrofluoric acid or the like which is performed later can be prevented.

Next, a resist mask is formed over the metal film, using a seventh photomask, and the metal film and the silicon film are selectively etched, so that the silicon layer 524 and a second electrode 701 which overlap with a first opening are formed. The resist mask is removed after the etching.

A cross-sectional view of the semiconductor device manufactured through the preceding steps corresponds to FIG. 7B.

Next, a resist mask is formed using an eighth photomask, and a fourth insulating film 522 and a fifth insulating film 523 are selectively etched, so that a contact hole reaching a semiconductor layer, a contact hole reaching a gate electrode, and a second opening reaching the first electrode 509 are formed. Then, the resist mask is removed after the etching.

A cross-sectional view of the semiconductor device manufactured through the preceding steps corresponds to FIG. 7C.

Next, an oxide film on an exposed surface of the semiconductor layer and an exposed surface of the first electrode is removed with an etchant containing hydrofluoric acid, and at the same time, the exposed surface of the semiconductor layer and the exposed surface of the first electrode are washed. Note that an upper surface of the silicon layer 524 is covered with the second electrode 701, whereby reduction in thickness of the upper surface of the silicon layer 524 in this washing step is prevented. In this embodiment mode, the second electrode 701 is a titanium nitride film, which has resistance to etching.

Next, a conductive film is formed by a sputtering method. This conductive film is formed of a single layer of an element selected from Ti, W, Mo, Al, and Cu, or an alloy material or a compound material containing the element as its main component, or a stacked layer thereof. In this embodiment mode, three layers of a Ti film with a thickness of 100 nm, an Al film containing a minute amount of Si with a thickness of 350 nm, and a Ti film with a thickness of 100 nm are stacked.

Next, a resist mask is formed using a ninth photomask and the conductive film is selectively etched, so that source or drain electrodes 525 to 534, gate lead wirings 535 to 539, a third electrode 541 and a fifth electrode 702 of the memory element, and a fourth electrode 542 of an antenna portion are formed. The fifth electrode 702 overlaps with the second electrode 701 to reduce electric resistance of a wiring. In addition, the third electrode 541 overlaps with the second opening to be electrically connected to the first electrode 509. Note that although not shown here, the fourth electrode 542 is electrically connected to a TFT of an antenna portion and power supply portion. The resist mask is removed after the etching.

A cross-sectional view of the semiconductor device manufactured through the preceding steps corresponds to FIG. 7D. Also in this embodiment mode, TFTs of a logic circuit portion, TFTs and a memory portion of a storage device portion 602, and TFTs of an antenna portion and power supply portion can be formed over the same substrate with the use of nine photomasks.

Next, a sixth insulating film 543 which covers the TFTs of a logic circuit portion 601, the TFT and the memory element of a storage device portion 602, and the TFTs of an antenna portion and power supply portion 603 is formed. An insulating film containing silicon oxide or an organic resin film is used for the sixth insulating film 543. The insulating film containing silicon oxide is preferably used for improving reliability of a wireless chip. Alternatively, an organic resin film formed by a coating method is preferably used because the sixth insulating film 543 desirably has a planarized surface in the case where an antenna to be formed later is formed by a screen printing method. The film used as the sixth insulating film 543 may be appropriately selected by practitioners.

Next, a resist mask is formed using a tenth photomask, and the sixth insulating film 543 is selectively etched, so that a fourth opening reaching the fourth electrode 542 is formed. The resist mask is removed after the etching.

A cross-sectional view of the semiconductor device manufactured through the preceding steps corresponds to FIG. 8A.

Next, a base film 545 of the antenna is formed over the sixth insulating film 543 by a sputtering method using a metal mask or a droplet discharging method. The base film 545 of the antenna is formed of a single layer of an element selected from Ti, Ni, and Au, or a stacked layer thereof. Note that the base film 545 here may be formed in such a manner that a resist mask is formed using a photomask and a metal film is selectively etched.

A cross-sectional view of the semiconductor device manufactured through the preceding steps corresponds to FIG. 7B.

Next, the antenna 546 is formed over the base film 545. The antenna 546 can be formed by a screen printing method, or the antenna 546 can be formed in such a manner that a metal film is formed by a sputtering method and then patterned using a photomask. If reduction in the number of photomasks is prioritized, the antenna 546 may be formed by a screen printing method.

A cross-sectional view of the semiconductor device manufactured through the preceding steps corresponds to FIG. 8C. In this embodiment mode, the TFTs of the logic circuit portion 601, the TFT and the memory element 600 of the storage device portion 602, and the TFTs and the antenna of the antenna portion and power supply portion 603 can be formed over the same substrate with the use of ten photomasks.

In addition, if a driver circuit is designed and manufactured using only a p-channel TFT in order to reduce the number of photomasks, two photomasks become unnecessary, and the wireless chip can be formed using eight photomasks in total.

Moreover, the subsequent steps are carried out as in Embodiment Mode 3, so that the wireless chip can be completed.

Furthermore, although the example in which the resist mask is formed using the photomask is described in this embodiment mode, there is no particular limitation on the patterning technique. The resist mask may be formed in such a manner that a resist material is selectively formed by a droplet discharging method without using the photomask.

The semiconductor device of this embodiment mode includes a memory element in which a silicon film is interposed between a first electrode and a second electrode formed using a material different from the first electrode, and a circuit which changes a polarity of applying voltage to the memory element for writing (or reading) into a different polarity of that for reading (or writing). Therefore, the memory element utilizing silicide reaction can be operated with using the same voltage value for writing and for reading. The semiconductor device described in this embodiment mode has no necessity to be provided with a circuit which changes voltage values to be different for writing and for reading, such as a boosting circuit. Accordingly, the scale of a circuit can be drastically reduced and a device can be miniaturized.

Embodiment Mode 5

Figure 9A:
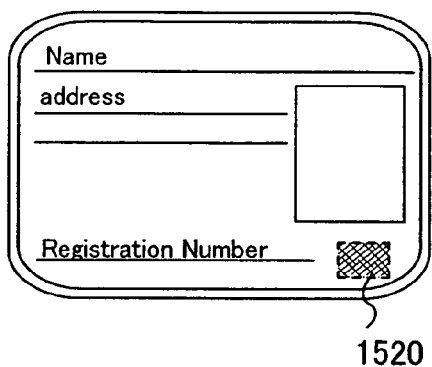
FIGS. 9A to 9F are views each illustrating an example of an electronic appliance.
Figure 9B:
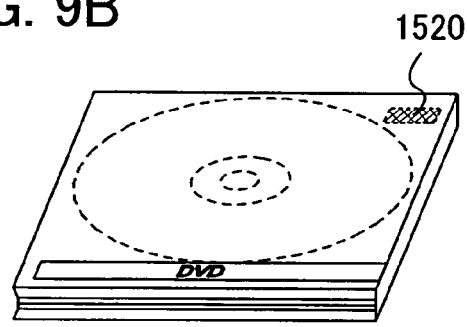
Figure 9C:
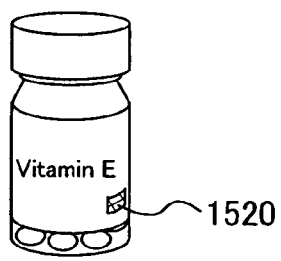
Figure 9D:
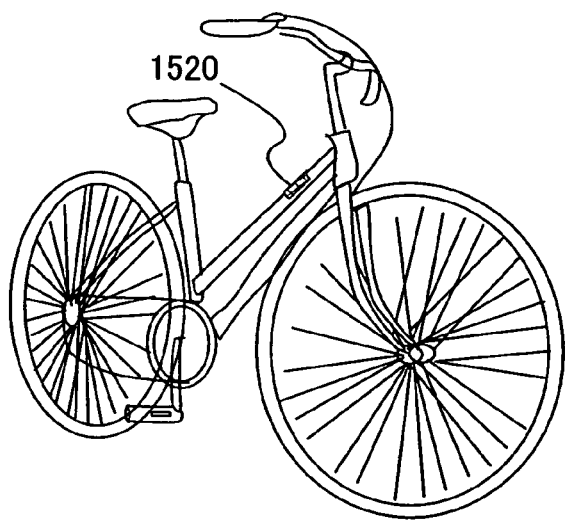
Figure 9E:
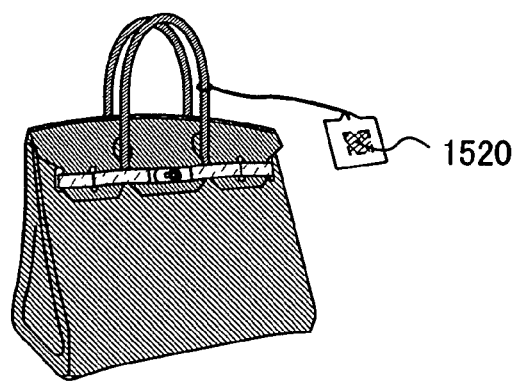
Figure 9F:
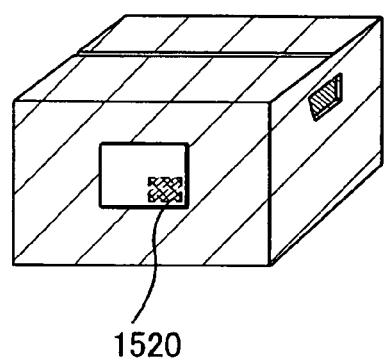

The memory element described in the above embodiment mode can be used for various applications. For example, the wireless chip can be used as a wireless chip for bills, coins, securities, bearer bonds, identification certificates (driver's licenses, certificates of residence, and the like, see FIG. 9A), containers for package (package paper, bottles, and the like, see FIG. 9C), recording media (DVD software, video tapes, and the like, see FIG. 9B), vehicles (bicycles and the like, see FIG. 9D), personal belongings (bags, glasses, and the like), foods, plants, animals, clothes, commodities, tags for packages or articles such as electronic appliances (see FIGS. 9E and 9F), and the like. The electronic appliances include a liquid crystal display device, an EL display device, a television device (also simply referred to as a TV, a TV receiving machine, or a television receiving machine), a cellular phone, and the like.

The semiconductor device 1520 of the present invention is fixed to a product by being mounted on a printed board, being attached to the surface of the article, being implanted in the article, or the like. For example, if the product is a book, the semiconductor device 1520 is fixed to the book by being embedded inside a paper, and if the product is a package made of an organic resin, the semiconductor device 1520 is fixed to the package by being embedded inside the organic resin. Since the semiconductor device 1520 of the present invention can be compact, thin, and lightweight, the design quality of the product itself is not degraded even after the device is fixed to the product. When the semiconductor device 1520 is provided to bills, coins, securities, bearer bonds, identification certificates, or the like, a certification function can be provided and the forgery can be prevented with the utilization of the certification function. Moreover, when the semiconductor device of the present invention is provided in containers for package, recording media, personal belongings, foods, clothes, commodities, electronic appliances, and the like, systems such as an inspection system can become more efficient.

Figure 10:
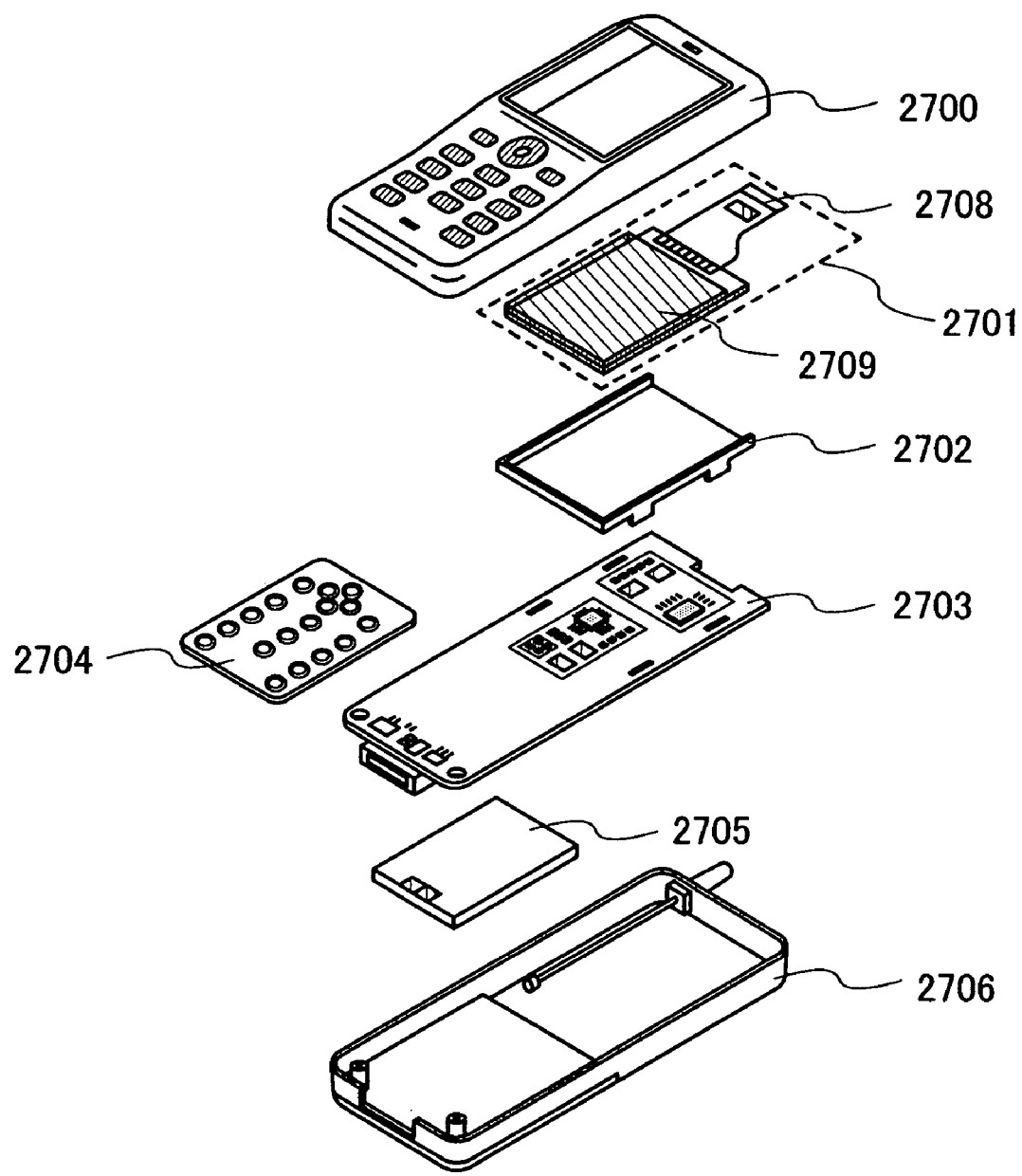
FIG. 10 is a view illustrating an example of an electronic appliance.

Next, an aspect of an electronic appliance to which the semiconductor device of the present invention is mounted is explained with reference to the drawing. An electronic appliance shown here as an example is a cellular phone including chassis 2700 and 2706, a panel 2701, a housing 2702, a printed wiring board 2703, operation buttons 2704, and a battery 2705 (see FIG. 10). The panel 2701 is detachably incorporated into the housing 2702 and the housing 2702 is fitted into the printed wiring board 2703. The shape and size of the housing 2702 are appropriately modified in accordance with an electronic appliance to which the panel 2701 is incorporated. The printed wiring board 2703 has a plurality of packaged semiconductor devices mounted thereto. The semiconductor device of the present invention can be used as one of the packaged semiconductor devices. The plurality of semiconductor devices mounted to the printed wiring board 2703 has any function of a controller, a central processing unit (CPU), memory, a power supply circuit, an audio processing circuit, a transmitting/receiving circuit, and the like.

The panel 2701 is bonded to the printed wiring board 2703 through a connection film 2708. The panel 2701, the housing 2702, and the printed wiring board 2703 are placed inside the chassis 2700 and 2706 together with the operation buttons 2704 and the battery 2705. A pixel region 2709 in the panel 2701 is placed so as to be viewable from an opening window provided in the chassis 2700.

A semiconductor device of the present invention has no necessity to be provided with a circuit which changes voltage values to be different for writing data into the memory element and for reading the data, such as a boosting circuit. Accordingly, the scale of a circuit can be drastically reduced and a device can be miniaturized, and thus the limited space in the chassis 2700 and 2706 of the electronic appliance can be effectively used.

The semiconductor device of the present invention includes a storage element with a simple structure in which a silicon film which undergoes silicide reaction by external electrical action is interposed between a pair of conductive layers; thus, an inexpensive electronic appliance using a semiconductor device can be provided.

Moreover, a storage device included in the semiconductor device of the present invention, which writes data by external electrical action, is nonvolatile and capable of adding data. Therefore, forgery by rewriting can be prevented, and new data can be additionally written.

Note that the shapes of the chassis 2700 and 2706 are examples of an exterior shape of the cellular phone, and the electronic appliance of this embodiment mode can be changed into various modes in accordance with functions or applications thereof.

This application is based on Japanese Patent Application serial No. 2006-288788 filed in Japan Patent Office on Oct. 24, 2006, the contents of which are hereby incorporated by reference.

What is claimed is:

1. A semiconductor device including a storage device, the storage device comprising:
a memory element having:
a first conductive layer;
a film including silicon formed over the first conductive layer; and
a second conductive layer formed over the film including silicon, the second conductive layer comprising a material different from that of the first conductive layer;
a first transistor having one electrode electrically connected to the first conductive layer; and
a second transistor having one electrode electrically connected to the first conductive layer, the other electrode grounded, and a gate electrode connected to the second conductive layer.

2. The device according to claim 1, wherein the film including silicon is a film including amorphous silicon, a film including microcrystalline, or a film including polycrystalline.

3. The device according to claim 1, wherein a work function of the second conductive layer is smaller than that of the first conductive layer.

4. The device according to claim 1, wherein each of the first conductive layer and the second conductive layer comprises an element selected from Ti, W, Ni, Cr, Mo, Ta, Co, Zr, V, Pd, Hf, Pt, and Fe.

5. The device according to claim 1, wherein the semiconductor device is a wireless chip and further comprises an antenna.

6. A semiconductor device including a storage device, the storage device comprising:
a memory element having:
a first conductive layer;
a film including silicon formed over the first conductive layer; and
a second conductive layer formed over the film including silicon, the second conductive layer comprising a material different from that of the first conductive layer;
a first transistor having one electrode electrically connected to the first conductive layer;
a second transistor having one electrode electrically connected to the first conductive layer and the other electrode grounded; and
a third transistor having one electrode electrically connected to the second conductive layer, the other electrode electrically connected to a gate electrode of the second transistor, and a gate electrode electrically connected to a gate electrode of the first transistor.

7. The device according to claim 6, wherein the film including silicon is a film including amorphous silicon, a film including microcrystalline, or a film including polycrystalline.

8. The device according to claim 6, wherein a work function of the second conductive layer is smaller than that of the first conductive layer.

9. The device according to claim 6, wherein each of the first conductive layer and the second conductive layer comprises an element selected from Ti, W, Ni, Cr, Mo, Ta, Co, Zr, V, Pd, Hf, Pt, and Fe.

10. The device according to claim 6, wherein the semiconductor device is a wireless chip and further comprises an antenna.

11. A method for driving a semiconductor device including a storage device including: a memory element in which a film including silicon is formed between a first conductive layer and a second conductive layer comprising a material different from the first conductive layer; a first transistor having one electrode electrically connected to the first conductive layer; and a second transistor having one electrode electrically connected to the first conductive layer, the other electrode grounded, and a gate electrode connected to the second conductive layer, comprising the steps of:

for writing data into the memory element, applying a first voltage value to a gate electrode of the first transistor to turn the first transistor on;

applying a second voltage value to the gate electrode of the second transistor to turn the second transistor off;

applying the first voltage value to the other electrode of the first transistor;

applying the first voltage value to the first conductive layer, and applying the second voltage value to the second conductive layer, thereby siliciding the film including silicon; and for reading the data written into the memory element, applying the first voltage value to the second conductive layer and applying the second voltage value to the first conductive layer, wherein first voltage value is higher than the second voltage value, and wherein when reading the data written into the memory element, the first voltage value is applied to the gate electrode of the first transistor and the gate electrode of the second transistor to turn them on, and a potential of the first conductive layer is read out from the other electrode of the first transistor.

12. The method according to claim 11, wherein a work function of the second conductive layer is smaller than that of the first conductive layer.

13. A method for driving a semiconductor device including a storage device including: a memory element in which a film including silicon is formed between a first conductive layer and a second conductive layer comprising a material different from the first conductive layer; a first transistor having a first electrode electrically connected to the first conductive layer; a second transistor having a first electrode electrically connected to the first conductive layer and a second electrode grounded; and a third transistor having a first electrode electrically connected to the second conductive layer, a second electrode electrically connected to a gate electrode of the second transistor, and a gate electrode electrically connected to a gate electrode of the first transistor, comprising the steps of:

for writing data into the memory element, applying a first voltage value to the gate electrode of the first transistor to turn the first transistor on, applying a second voltage value to the gate electrode of the second transistor to turn the second transistor off, applying the first voltage value to the gate electrode of the third transistor to turn the third transistor on, applying the first voltage value to the first conductive layer, and applying the second voltage value to the second conductive layer, thereby siliciding the film including silicon; and for reading the data written into the memory element, applying the first voltage value to the second conductive layer and applying the second voltage value to the first conductive layer, wherein first voltage value is higher than the second voltage value, and wherein for reading the data written into the memory element, the first voltage value is applied to the gate electrode of the first transistor, the gate electrode of the second transistor, and the gate electrode of the third transistor to turn them on, and a potential of the first conductive layer is read out from the other electrode of the first transistor.

14. The method according to claim 13, wherein a work function of the second conductive layer is smaller than that of the first conductive layer.

15. A method for driving a semiconductor device including a storage device including: a memory element in which a film including silicon is formed between a first conductive layer and a second conductive layer comprising a material different from the first conductive layer; a first transistor having one electrode electrically connected to the first conductive layer; and a second transistor having one electrode electrically connected to the first conductive layer, the other electrode grounded, and a gate electrode connected to the second conductive layer, the method comprising the steps of:

writing data into the memory element by applying a first voltage to the memory element; and reading the data written into the memory element by applying a second voltage to the memory element, wherein the first voltage and the second voltage are same values but different polarities, and wherein when reading the data written into the memory element, the first voltage value is applied to the gate electrode of the first transistor and the gate electrode of the second transistor to turn them on, and a potential of the first conductive layer is read out from the other electrode of the first transistor.

16. The method according to claim 15, wherein a work function of the second conductive layer is smaller than that of the first conductive layer.

17. The method according to claim 15, wherein the film including silicon in the memory element is silicided when the data is written into the memory element.

18. A method for driving a semiconductor device including a storage device including: a memory element in which a film including silicon is formed between a first conductive layer and a second conductive layer comprising a material different from the first conductive layer; a first transistor having a first electrode electrically connected to the first conductive layer; a second transistor having a first electrode electrically connected to the first conductive layer and a second electrode grounded; and a third transistor having a first electrode electrically connected to the second conductive layer, a second electrode electrically connected to a gate electrode of the second transistor, and a gate electrode electrically connected to a gate electrode of the first transistor, the method comprising the steps of:

writing data into the memory element by applying a first voltage to the memory element; and reading the data written into the memory element by applying a second voltage to the memory element, wherein the first voltage and the second voltage are same values but different polarities, and wherein for reading the data written into the memory element, the first voltage value is applied to the gate electrode of the first transistor, the gate electrode of the second transistor, and the gate electrode of the third transistor to turn them on, and a potential of the first conductive layer is read out from the other electrode of the first transistor.

19. The method according to claim 18, wherein a work function of the second conductive layer is smaller than that of the first conductive layer.

20. The method according to claim 18, wherein the film including silicon in the memory element is silicided when the data is written into the memory element.

* * * * *

UNITED STATES PATENT AND TRADEMARK OFFICE
CERTIFICATE OF CORRECTION

PATENT NO.        : 7,782,651 B2                                       Page 1 of 1
APPLICATION NO.   : 11/976202
DATED             : August 24, 2010
INVENTOR(S)       : Hajime Tokunaga et al.

It is certified that error appears in the above-identified patent and that said Letters Patent is hereby corrected as shown below:

At column 25, line 17, "laver" should be --layer--.

Signed and Sealed this
Twenty-fifth Day of December, 2012

David J. Kappos
*Director of the United States Patent and Trademark Office*